(12) United States Patent
Bito et al.

(10) Patent No.: US 7,723,987 B2
(45) Date of Patent: May 25, 2010

(54) MAGNETIC RESONANCE IMAGING SYSTEM

(75) Inventors: Yoshitaka Bito, Kokubunji (JP); Yo Taniguchi, Kokubunji (JP); Toru Shirai, Kokubunji (JP); Shinji Kurokawa, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 301 days.

(21) Appl. No.: 12/071,896

(22) Filed: Feb. 27, 2008

(65) Prior Publication Data
US 2009/0085563 A1 Apr. 2, 2009

(30) Foreign Application Priority Data
Sep. 27, 2007 (JP) ............... 2007-251893

(51) Int. Cl.
*G01V 3/00* (2006.01)
(52) U.S. Cl. ...................... 324/309; 324/307
(58) Field of Classification Search ............... 324/309, 324/307, 306
See application file for complete search history.

(56) References Cited

U.S. PATENT DOCUMENTS

| | | | | |
|---|---|---|---|---|
| 4,551,679 | A * | 11/1985 | Bossaert | 324/309 |
| 5,111,820 | A * | 5/1992 | Axel et al. | 600/413 |
| 5,578,924 | A * | 11/1996 | Dumoulin et al. | 324/309 |
| 5,749,834 | A * | 5/1998 | Hushek | 600/410 |
| 6,066,950 | A | 5/2000 | Tsukamoto et al. | |
| 6,479,995 | B1 | 11/2002 | Ogino | |
| 6,694,166 | B2 * | 2/2004 | Salome et al. | 600/410 |
| 6,838,879 | B2 * | 1/2005 | Kouwenhoven | 324/309 |
| 2003/0117139 | A1 | 6/2003 | Ikeda | |

FOREIGN PATENT DOCUMENTS

| | | |
|---|---|---|
| JP | 63-105749 | 10/1986 |
| JP | 11-056808 | 8/1997 |

OTHER PUBLICATIONS

Hakon Gudbjartsson et al., "Line Scan Diffusion Imaging", (1996), pp. 509-519.
Koichi Oshio et al.,, "Line Scan Echo Planar Spectroscopic Imaging", Magnetic Resonance in Medicine, vol. 44, (2000), pp. 521-524.
Hakon Gudbjartsson et al., "Double Line Scan Diffusion Imaging", (1997), pp. 101-109.

(Continued)

*Primary Examiner*—Louis M Arana
(74) *Attorney, Agent, or Firm*—Stites & Harbison, PLLC; Juan Carlos A. Marquez, Esq

(57) ABSTRACT

A magnetic resonance measurement technique is provided which shortens the measurement time while suppressing artifacts caused by body movement of a measuring object and enables high-speed imaging. An excitation pulse which excites a plurality of slice planes and an excitation pulse which excites slice planes perpendicular to the slice planes are applied and a plurality of substantially parallel linear crossing areas are simultaneously measured. Spatial information of a linear direction of the crossing areas is acquired by modulating a magnetic resonance signal from the crossing areas by a gradient magnetic field. A spatial information of a direction perpendicular to the linear direction is acquired by changing the position of the plane and an image is reconstructed.

14 Claims, 22 Drawing Sheets

OTHER PUBLICATIONS

Daniel K. sodickson et al., "simultaneous Acquisition of Spatial Harmonics (SMASH): Fast Imaging with Radiofrequency Coil Arrays", (1997), pp. 591-603.

Klaas P. Pruessmann et al., "SENSE" Sensitivity Encoding for Fast MRI, Magnetic Resonance in Medicine, vol. 42, (1999), pp. 952-962.

Y. Bito et al., "Echo-Planar Diffusion Spectroscopic Imaging: Reduction of Motion Artifacts Using Line-Scan Technique", Advanced Research Laboratory and Central Research Laboratory, Hitachi, Ltd., 1 page.

* cited by examiner (a)

(b) Cosine modulated sinc waveform (c) Excitation slice profile in real space (a) Sine modulated sinc waveform $$\frac{Sin\left(\frac{a}{2}(Xi-Xw)t\right)}{t} + \frac{Sin\left(\frac{a}{2}(Xi+Xw)t\right)}{t}$$

Time t (b) Excitation slice profile in real space (c) Sinc waveform $$\frac{Sin\left(\frac{a}{2}Xw\cdot t\right)}{t}$$

(d) Excitation slice profile in real space $$\begin{pmatrix} S(a,y) \\ S(b,y) \end{pmatrix} = \begin{pmatrix} W(a,L_i,y) \\ W(b,L_i,y) \end{pmatrix} F(L_i,y)$$

(a)

(b)

(c)

| z → | |
|---|---|
| 8 | 1 |
| 2 | 5 |
| 6 | 3 |
| 4 | 7 |
| 8 | 1 |
| 2 | 5 |
| 6 | 3 |
| 4 | 7 |

(a)

(b)

MAGNETIC RESONANCE IMAGING SYSTEM

CLAIM OF PRIORITY

The present application claims priority from Japanese application JP 2007-251893 filed on Sep. 27, 2007, the content of which is hereby incorporated by reference into his application.

BACKGROUND OF THE INVENTION

1. Field of the Invention

The present invention relates to a magnetic resonance imaging system. More particularly, the invention relates to a technique of performing high-speed imaging while suppressing artifacts caused by body movement.

2. Background Art

The magnetic resonance imaging system is an apparatus that transmits a measuring object placed in a static magnetic field with a high-frequency electromagnetic field (RF pulse) of a specific frequency and induces a nuclear magnetic resonance phenomenon to acquire physicochemical information of the measuring object. Magnetic resonance imaging (MRI) which is currently in wide-spread use mainly uses a nuclear magnetic resonance phenomenon of hydrogen nuclei in water molecules and images differences in the density of hydrogen nucleus or relaxation time or the like which varies from one tissue to another. After and/or with transmitting RF pulses, the MRI applies a slice gradient magnetic field, phase encoding gradient magnetic field and reading gradient magnetic field to add spatial information necessary to reconstruct the image to a magnetic resonance signal (echo).

When spatial information is added by repeatedly adding phase encoding gradient magnetic fields of different intensities before echo formation, if there is movement in the measuring object (body movement), a phase error is likely to be contaminated in the direction in which the phase encoding gradient magnetic field is applied (phase encoding direction) and artifact flowing in the phase encoding direction (body movement artifact) is prone to occur in the image to be reconstructed from an echo thereof. In diffusion weighted imaging, which measures the intensity of molecular diffusion of water, this body movement artifact becomes conspicuous. This is because the diffusion gradient magnetic field is intended to produce signal attenuation in accordance with the amount of diffusion coefficient and if body movement occurs while this diffusion gradient magnetic field is being applied, a large phase error occurs.

Imaging methods such as an Echo Planar Imaging (EPI) method and a line scan method, which do not repeatedly apply the above described phase encoding gradient magnetic field, have little influence of body movement artifact. However, the EPI method applies a gradient magnetic field called an "oscillating gradient magnetic field" while acquiring echoes by switching the gradient magnetic field at a high speed. This requires a high performance gradient magnetic field system and causes the image to be distorted due to the influence of an inhomogeneous static magnetic field.

The line scan method selects and excites one slice plane by a first RF pulse, selects and inverts another slice plane which crosses the selected and excited slice plane by a second RF pulse (inversion pulse) and measures an echo from a linear area in which the two slice planes cross each other. The linear area is sequentially moved, measurement is repeated and the area necessary to reconstruct the image is measured. The line scan method does not use any phase encoding gradient magnetic field, and is therefore used for diffusion weighted imaging when measuring regions susceptible to body movement (e.g., see Non-Patent Document 1). The technique is also available to be combined to chemical shift imaging which separates and images each metabolite distribution using chemical shift of a metabolite and diffusion weighted imaging (EPSI: Echo Planar Spectroscopic Imaging) with the line scan method (e.g., Patent Document 1, Non-Patent Documents 2 and 3).

Some methods have been proposed to shorten the measurement time by the line scan method such as a method of moving a crossing area in a direction inclined with respect to both of the two slice planes and shortening a repetition time (see, Patent Document 2, for example) and a method of applying a first excitation pulse twice, using two echoes thereby obtained and simultaneously acquiring two slices (see, Non-Patent Document 4, for example). Furthermore, in order to improve the quality of a reconstructed image obtained by the line scan method, a method changing the amplitude of a crusher gradient magnetic field applied so as to prevent a resonant signal in a previously excited crossing area to be contaminated therein when scanning the crossing area has been proposed (see, Patent Document 3, for example). Furthermore, in order to increase spatial resolution of an image obtained by the line scan method, a method of acquiring crossing areas superimposed on each other and meticulously imaging the inside of the crossing area by high-speed imaging has been proposed (see, Patent Document 4, for example). A method of detecting large body movement and remeasuring it to prevent losses of images which may occur when large body movement takes place has been proposed (see, Patent Document 5, for example).

On the other hand, among general measurement methods of MRI, a method is proposed which uses differences in sensitivity distribution among a plurality of RF coils to shorten the measurement time (see, Non-Patent Documents 5 and 6, for example). The method performs measurement by reducing the number of times a phase encoding gradient magnetic field applied, and obtained folded image in the phase encoding direction is unfolded using differences in sensitivity distribution among the respective RF coils. Since the number of times phase encoding applied decreases, the measurement time is shortened. Furthermore, shortening of the measurement time also reduces the probability that body movement occur during the measurement time which leads suppression of body movement artifacts.

[Patent Document 1] JP Patent No. 3588690
[Patent Document 2] JP Patent Publication (Kokai) No. 63-105749A (1988)
[Patent Document 3] JP Patent No. 3342853
[Patent Document 4] JP Patent No. 3415754
[Patent Document 5] JP Patent No. 3884283
[Non-Patent Document 1] Gudbjartsson H et al., Line scan diffusion imaging. Magnetic Resonance in Medicine, vol. 36, pp. 509-519 (1996)
[Non-Patent Document 2] Bito Y et al., Echo-planar diffusion spectroscopic imaging: reduction of motion artifacts using line-scan technique. Proceedings of International Society for Magnetic Resonance in Medicine, p. 1235 (1998)
[Non-Patent Document 3] Oshio K et al., Line scan echo planar spectroscopic imaging. Magnetic Resonance in Medicine, vol. 44, pp. 521-524 (2000)
[Non-Patent Document 4] Gudbjartsson H et al., Double line scan diffusion imaging. Magnetic Resonance in Medicine, vol. 38, pp. 101-109 (1997)
[Non-Patent Document 5] Sodickson D K et al., Simultaneous acquisition of spatial harmonics (SMASH): fast imaging with radiofrequency coil arrays. Magnetic Resonance in Medicine, vol. 38, pp. 591-603 (1997)

[Non-Patent Document 6] Pruessmann K P et al., SENSE: Sensitivity encoding for fast MRI. Magnetic Resonance in Medicine, vol. 42, pp. 952-962 (1999)

SUMMARY OF THE INVENTION

The methods described in Patent Documents 2 and 3 are not sufficient to shorten the measurement time because a minimum necessary time to measure one echo, switching speed of a gradient magnetic field and amount of RF applied or the like are restricted. Especially, the chemical shift imaging which combines line scan and EPSI requires further reduction of the measurement time. This is because influences of body movement artifacts become larger since a stronger diffusion gradient magnetic field is applied.

The present invention has been implemented in view of the above described circumstances and it is an object of the present invention to provide a magnetic resonance measurement technique which shortens the measurement time while suppressing artifacts caused by body movement of a measuring object and enables high-speed imaging.

The present invention measures a plurality of substantially parallel linear crossing areas simultaneously and reconstructs an image from the measurement result.

More specifically, the invention provides a magnetic resonance imaging system including an RF pulse application section which applies a high-frequency electromagnetic field (RF) pulse to a measuring object, a gradient magnetic field application section which applies a gradient magnetic field for adding spatial modulation to the magnetic resonance signal, a signal detection section which measures a magnetic resonance signal caused by the RF pulse, a calculation section which reconstructs an image from the magnetic resonance signal measured by the signal detection section, and a control section which controls operations of the RF pulse application section, the signal detection section, the gradient magnetic field application section and the calculation section, characterized in that the control section performs control so as to apply a first RF pulse having a plurality of substantially parallel excitation planes together with a first gradient magnetic field, apply a second RF pulse together with a second gradient magnetic field in a direction different from the direction in which the first gradient magnetic field is applied and controls the RF pulse application section and the gradient magnetic field application section so as to apply a third gradient magnetic field in a direction perpendicular to both the first gradient magnetic field and the second gradient magnetic field for a period during which the signal detection section measures the magnetic resonance signal.

According to the present invention, it is possible to provide a magnetic resonance measurement technique which shortens the measurement time while suppressing artifacts caused by body movement of a measuring object and enables high-speed imaging.

DETAILED DESCRIPTION OF THE PREFERRED EMBODIMENTS

First Embodiment

Hereinafter, preferred embodiments for implementing the present invention will be explained. A first embodiment to which the present invention is applied will be explained first. This embodiment scans a plurality of linear crossing areas (lines) simultaneously. Hereinafter, a case where two lines are scanned simultaneously will be explained as an example.

Figure 1:
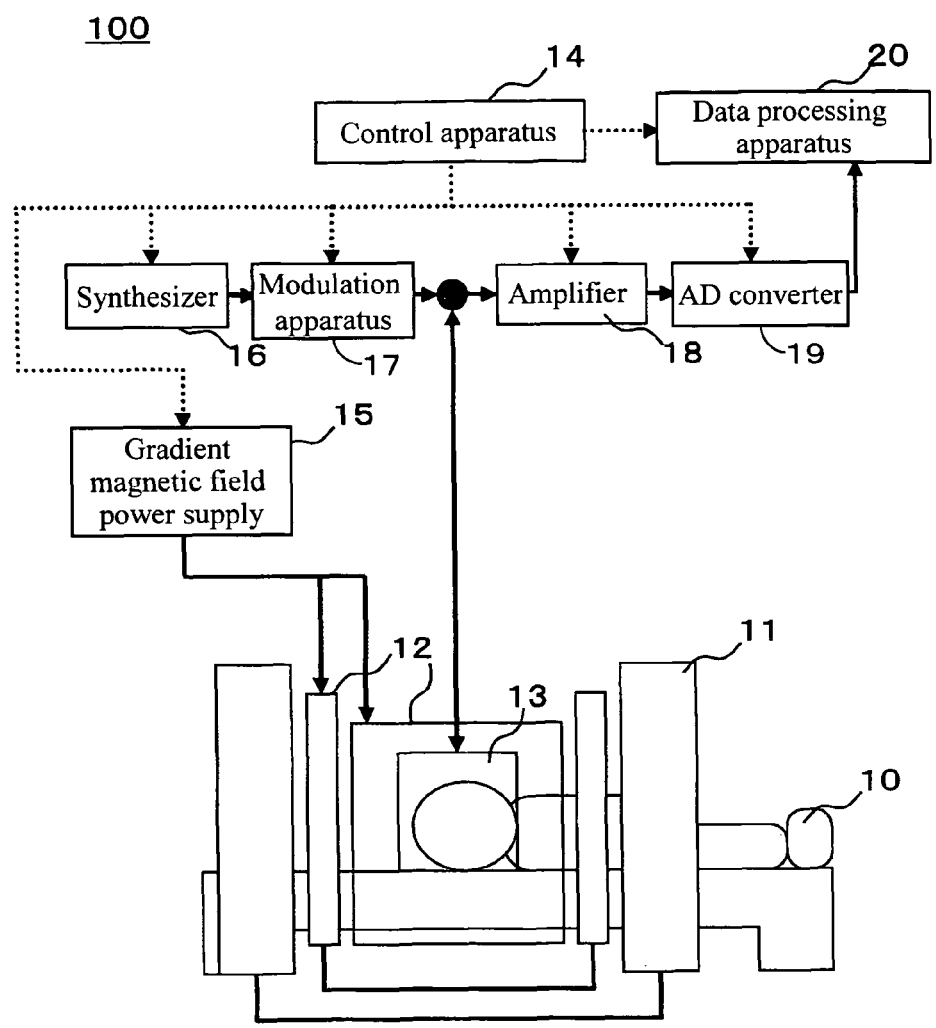
FIG. 1 illustrates an overview of a magnetic resonance imaging system according to a first embodiment.

First, the apparatus configuration of a magnetic resonance imaging system of this embodiment will be explained. FIG. 1 illustrates an overview of a magnetic resonance imaging system 100 of this embodiment. The magnetic resonance imaging system 100 is provided with a static magnetic field generation magnet 11, a gradient magnetic field generation coil 12, an RF coil system 13, a control apparatus 14, a gradient magnetic field power supply 15, a synthesizer 16, a modulation apparatus 17, an amplifier 18, an AD converter 19 and a data processing apparatus 20.

The synthesizer 16 and the modulation apparatus 17 constitute a transmission section. The synthesizer 16 generates a high-frequency signal and the modulation apparatus 17 shapes the waveform of the high-frequency signal generated by the synthesizer 16, amplifies the power and supplies a current to the RF coil system 13. The RF coil system 13 generates a high-frequency electromagnetic field (excitation pulse: RF pulse) to excite nuclear spin of a measuring object 10 using the supplied current. The gradient magnetic field power supply 15 supplies a current to the gradient magnetic field generation coil 12, the gradient magnetic field generation coil 12 supplied with the current generates a gradient magnetic field and modulates a magnetic resonance signal from the measuring object 10 according to the spatial position. The RF coil system 13 receives (detects) the modulated magnetic resonance signal. The amplifier 18 amplifies the magnetic resonance signal received by the RF coil system 13. The AD converter 19 A/D-converts the amplified magnetic resonance signal and inputs the converted data to the data processing apparatus 20. The data processing apparatus 20 processes and saves the data of the inputted data. The control apparatus 14 performs control so that the respective apparatuses operate at programmed timings.

The magnetic resonance imaging system 100 of this embodiment realizes, through the above described apparatuses, the functions of an RF pulse application section which transmits a high-frequency electromagnetic field onto the measuring object, a signal detection section which detects a magnetic resonance signal caused by the high-frequency electromagnetic field applied by the RF pulse application section, a gradient magnetic field application section which applies a gradient magnetic field for adding spatial information to the magnetic resonance signal and a calculation section which reconstructs an image from the magnetic resonance signal detected by the signal detection section. The RF pulse application section is realized by the portion related to transmission of the high-frequency electromagnetic field out of the RF coil system 13, the synthesizer 16, the modulation apparatus 17 and the hardware and control software for applying the high-frequency electromagnetic field out of the control apparatus 14. The signal detection section is realized by the portion related to detection of the magnetic resonance signal out of the RF coil system 13, the amplifier 18, the AD converter 19 and the hardware and control software for detecting the magnetic resonance signal out of the control apparatus 14. The gradient magnetic field application section is realized by the gradient magnetic field generation coil 12, the gradient magnetic field power supply 15 and the hardware and control software which applies a gradient magnetic field out of the control apparatus 14. Furthermore, the calculation section is realized by the data processing apparatus 20 and the hardware and control software related to data processing out of the control apparatus 14.

Depending on the configuration, the RF pulse application section, signal detection section, gradient magnetic field application section and calculation section may share hardware and software so that the hardware and software are not separable. For example, when the RF coil system 13 is constructed of a RF coil which is a transmission/reception dual-purpose coil which serves as the transmission coil and the reception coil of a high-frequency electromagnetic field at the same time, this RF coil belongs to the RF pulse application section as well as the signal detection section. Furthermore, since transmission and reception of the high-frequency electromagnetic field and modulation by the gradient magnetic field or the like do not operate independently of each other, the control software which belongs to the respective sections includes a portion that integrates those operations. The configuration shown here is a typical configuration, but the present invention is not limited to this.

Figure 2:
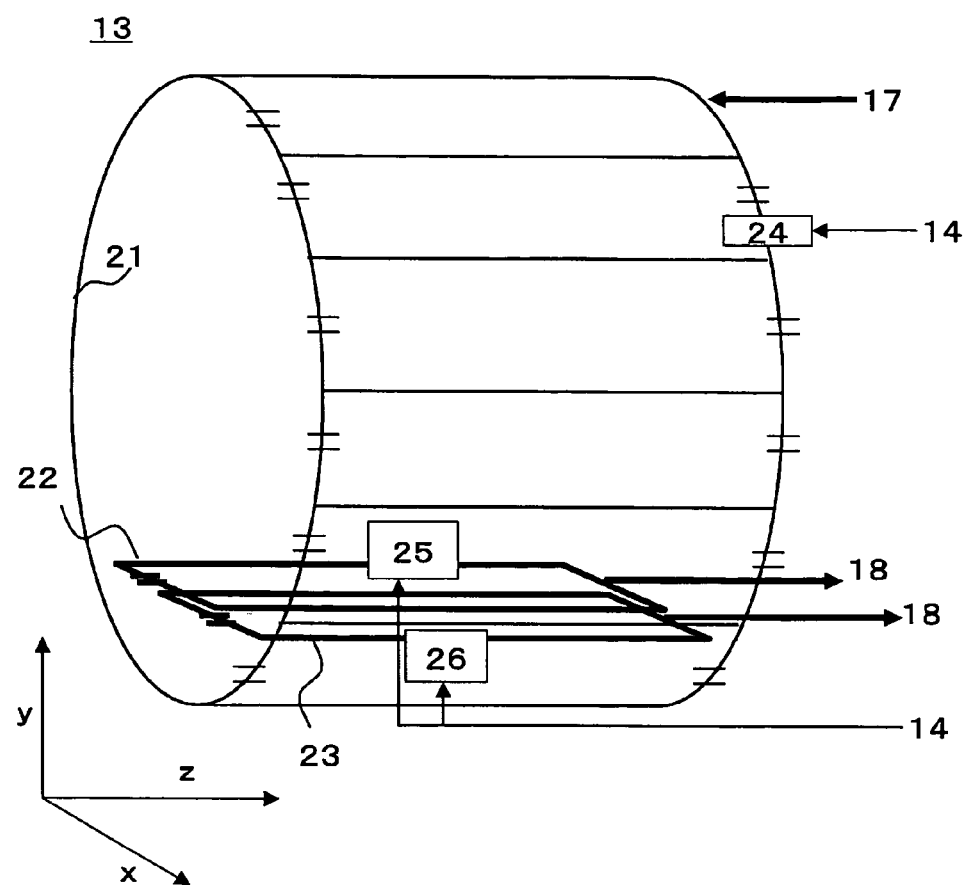
FIG. 2 is a configuration diagram of a RF coil system according to the first embodiment.

Next, the RF coil system 13 will be explained in detail. FIG. 2 shows the configuration of the RF coil system 13 of this embodiment. The RF coil system 13 of this embodiment is provided with RF coils 21, 22 and 23 and detuning circuits 24, 25 and 26.

The RF coil 21 belongs to the RF pulse application section and functions as an antenna that transmits an excitation pulse to the measuring object 10. The RF coil 21 is provided with a coil and a capacitor and the size (inductance (L)) of the coil and capacitance (C) of the capacitor are adjusted so as to match the resonance frequency of the magnetic resonance signal. The RF coil 22 and RF coil 23 belong to the signal detection section and function as an antenna that receives a magnetic resonance signal generated from the measuring object 10. The RF coil 22 and RF coil 23 are provided with a coil and a capacitor and the coil size (L) and the capacitance (C) of the capacitor are adjusted so as to match the resonance frequency of the magnetic resonance signal as in the case of the RF coil 21. The RF coils 22 and 23 are connected to the amplifier 18 respectively and the acquired magnetic resonance signal is transferred over to the data processing apparatus 20 separately. Furthermore, according to this embodiment, the RF coil 22 and RF coil 23 are loop coils and arranged so that their loop planes are parallel to the xz plane.

The detuning circuits 24, 25 and 26 detune the LC resonance frequency with the RF coils 22 and 23, and the RF coil 21 from the frequency of the magnetic resonance signal at the time of transmission and reception of the high-frequency electromagnetic field and prevents interference between the coils. That is, the detuning circuits 25 and 26 are operated based on a control signal from the control apparatus 14 to detune the LC resonance frequency from the frequency of the magnetic resonance signal so that the RF coils 22 and 23 do not function as the antenna when an excitation pulse is applied. On the other hand, when a signal is detected, the detuning circuit 24 is operated based on a control signal from the control apparatus 14 to detune the LC resonance frequency of the RF coil 21 from the frequency of the magnetic resonance signal so that the RF coil 21 does not function as the antenna.

This configuration shown is a typical example and the number of RF coils, the shapes and the detuning circuits are not limited to this example. For example, the number of RF coils used to detect a signal may be three or more. Furthermore, the RF coils may be arranged so as to surround the measuring object. Furthermore, the plurality of RF coils may serve for both transmission and reception. Furthermore, the respective RF coils may have various shapes such as circular, rectangular, birdcage shape, butterfly shape or saddle shape and the arrangement of capacitors is not particularly limited either. For simplicity, the figure shows only one location of each of the detuning circuits 24, 25 and 26 but the detuning circuits 24, 25 and 26 may be arranged at a plurality of locations to improve the detuning effect.

Next, the processing of the RF pulse application section, signal detection section, gradient magnetic field application section and calculation section according to this embodiment will be explained in detail. In this embodiment, the RF pulse application section, signal detection section and gradient magnetic field application section operate according to instructions from the control apparatus 14 and acquire echoes from the measuring object. The calculation section processes the echoes obtained and reconstructs echoes into an image.

First, the technique of acquiring echoes by the RF pulse application section, signal detection section and gradient magnetic field application section of this embodiment and echoes acquired will be explained. The control apparatus 14 controls the respective sections according to programmed timings (imaging pulse sequence). Hereinafter, operations of the respective sections will be explained according to an imaging pulse sequence of this embodiment.

FIG. 3(a) shows an imaging pulse sequence of this embodiment. Here, the horizontal axis shows time (t), the vertical axis shows a high-frequency electromagnetic field RF, gradient magnetic fields Gx, Gy and Gz in the x, y and z directions and their respective operation timings and intensities. AD is a data acquisition period.

Simultaneously with the application of a slice gradient magnetic field 32 in the x direction, a first RF pulse 31 of frequency fn having two excitation planes is applied and a nuclear magnetic resonance phenomenon is induced in predetermined two slices in the x direction. Here, by modulating a sinc waveform using a continuous periodic function waveform, it is possible to obtain an RF pulse having a plurality of excitation planes. This embodiment modulates the sinc waveform shown in (Formula 1) with a cosine waveform and uses a pulse whose amplitude is set to 90 degrees (90-degree pulse) as the first RF pulse 31.

$$-\frac{\sin\left(\frac{a}{2}(Xi - Xw)t\right)}{t} + \frac{\sin\left(\frac{a}{2}(Xi + Xw)t\right)}{t} \quad \text{(Formula 1)}$$

This waveform is shown in FIG. 3(b). The RF pulse shown in this figure has two modulation frequency bands. By applying such an RF pulse together with a gradient magnetic field which is kept at a constant amplitude during a period of application of the RF pulse, two parallel planes which are two magnetic field strength bands corresponding to the two modulation frequency bands are excited. FIG. 3(c) shows a slice profile of an excitation area in a real space excited when the RF pulse of this waveform is applied under application of a gradient magnetic field of certain amplitude. In this figure, Xi denotes the distance between two excited slice planes, Xw denotes the respective thicknesses of the two slice planes. That is, two areas having a thickness of Xw and separated from each other by the distance Xi are excited by the application of the RF pulse of this waveform.

Next, in addition to the application of a slice gradient magnetic field 34 in the z direction, a second RF pulse 33 of frequency fm having one excitation plane is applied and magnetization in a predetermined one slice in the z direction is inverted. As the second RF pulse 33, a pulse having a sinc waveform and whose amplitude is set to 180 degrees (180-degree pulse) is used. While applying a read-out gradient magnetic field 36 in the y direction, an echo 35 which is a magnetic resonance signal is acquired in a time-period of AD 37.

As described above, the magnetic resonance signals acquired by the RF coils 22 and 23 in the RF coil system 13 are acquired separately. Hereinafter, when they need to be distinguished, they will be called "echoes $35_{22}$ and $35_{23}$" respectively. Furthermore, for simplicity, the first RF pulse 31 and the slice gradient magnetic field 32 together will be called a "first excitation pulse" and the second RF pulse and the slice gradient magnetic field 34 together will be called a "second excitation pulse."

Figure 4:
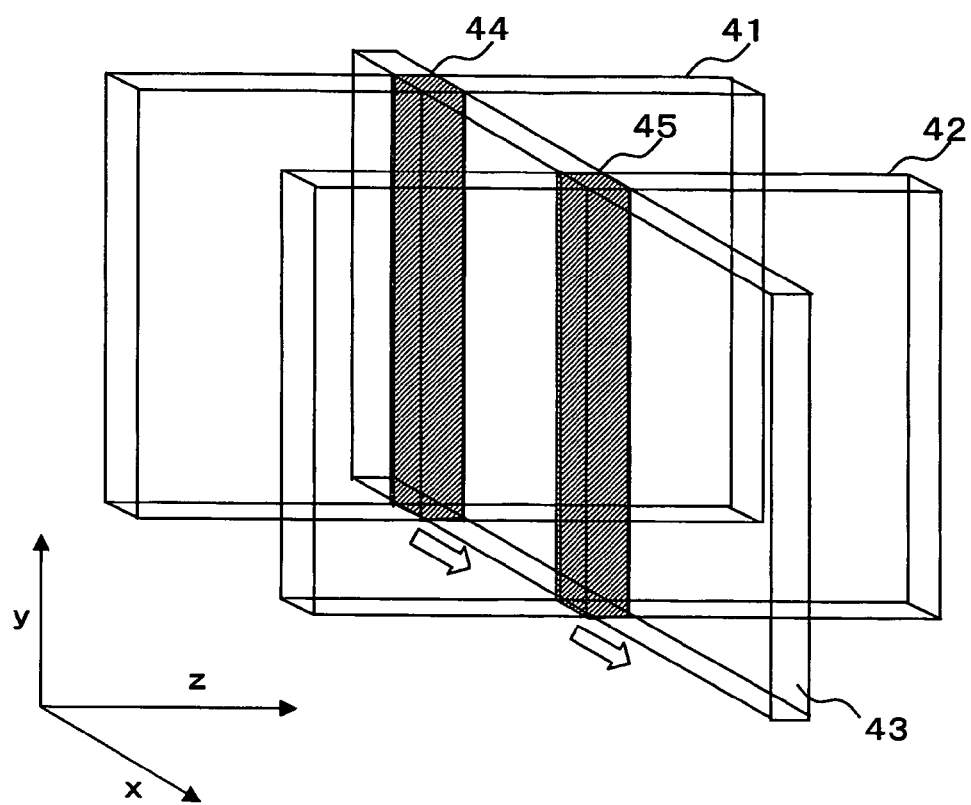
FIG. 4 is a schematic view of an area excited by the imaging pulse sequence of the first embodiment.

FIG. 4 shows areas where a nuclear magnetic resonance phenomenon is induced by the first excitation pulse and the second excitation pulse. Slice planes 41 and 42 are planes excited by the first excitation pulse and a slice plane 43 is a plane excited by the second excitation pulse. As shown in the figure, the areas where an echo 35 is generated are two linear areas; an area (crossing area) 44 where the slice plane 41 and the slice plane 43 cross each other and an area (crossing area) 45 where the slice plane 42 and the slice plane 43 cross each other. The spatial information in the y direction is obtained by applying the read-out gradient magnetic field 36. The echo 35 is formed by the magnetic resonance signals from these two crossing areas. Therefore, this embodiment needs to separate the echo 35 obtained and extract magnetic resonance signals from the respective areas. Separation is performed by the calculation section.

Next, the processing by the calculation section will be explained. As described above, the calculation section reconstructs an image from the echo 35 obtained according to the above described imaging pulse sequence. This embodiment separates the magnetic resonance signals from the two crossing areas 44 and 45 using sensitivity distributions of the respective RF coils 22 and 23.

Figure 5:
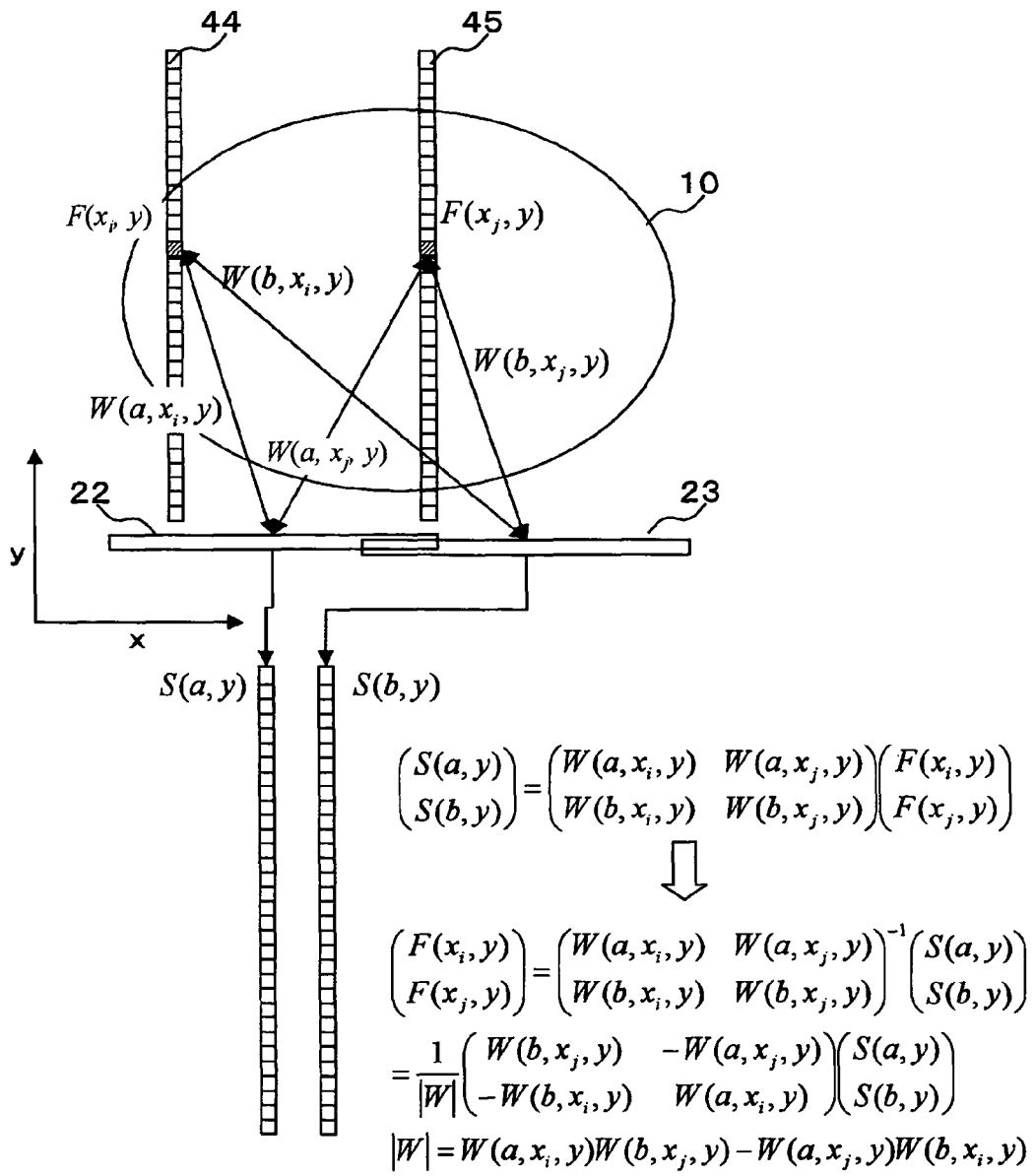
FIG. 5 illustrates a method of separating a one-dimensional image of the first embodiment.

The calculation section performs an inverse Fourier transform on the echoes $35_{22}$, $35_{23}$ obtained by the respective RF coils 22 and 23, obtains a one-dimensional image in the y direction (obtains spatial information in the y direction). However, the one-dimensional image in the y direction obtained here is a mixture of the signals from the two crossing areas 44 and 45. Using the sensitivity distributions of the respective RF coils 22 and 23, the one-dimensional image is separated into one-dimensional images of the two crossing areas 44 and 45. Hereinafter, the separation procedure will be explained. FIG. 5 illustrates the technique for separating the one-dimensional images obtained from the respective RF coils 22 and 23 into two images of the crossing areas 44 and 45 using the sensitivity distributions of the respective RF coils 22 and 23.

Suppose the intensity of the signal (measurement signal) from coordinates $(x_i, y)$ on the crossing area 44 is $F(x_i, y)$, the intensity of the signal (measurement signal) from coordinates $(x_j, y)$ on the crossing area 45 is $F(x_j, y)$, the data of the magnetic resonance signal measured by the RF coil 22 and converted into a one-dimensional image is $S(a, y)$ and data of the magnetic resonance signal measured by the RF coil 23 and converted into a one-dimensional image is $S(b, y)$. The sensitivity distributions W of the respective RF coils 22 and 23 are determined by the position and the structure of the measuring object. Hereinafter, sensitivities of the RF coils 22 and RF coil 23 when the signal at the position (x, y) is measured are expressed as $W(a, x, y)$, $W(b, x, y)$ respectively.

The data $S(a, y)$ is the sum of the intensity $F(x_i, y)$ of the measurement signal from coordinates $(x_i, y)$ on the crossing area 44 multiplied by sensitivity $W(a, x_i, y)$ of the RF coil 22 at that position and the intensity $F(x_j, y)$ of the signal (measurement signal) from coordinates $(x_j, y)$ on the crossing area 45 multiplied by sensitivity $W(a, x_j, y)$ of the RF coil 22. The same applies to the data $S(b, y)$. Therefore, the data S measured by the respective RF coils 22 and 23 and original signal intensity F and sensitivity W are expressed by following (Formula 2).

$$\begin{pmatrix} S(a, y) \\ S(b, y) \end{pmatrix} = \begin{pmatrix} W(a, x_i, y) & W(a, x_j, y) \\ W(b, x_i, y) & W(b, x_j, y) \end{pmatrix} \begin{pmatrix} F(x_i, y) \\ F(x_j, y) \end{pmatrix} \quad \text{(Formula 2)}$$

Here, the matrix composed of sensitivity W in (Formula 2) is called a "sensitivity matrix A." When the determinant of the sensitivity matrix A is not 0, intensity F of the measurement signals of the respective coordinates of the crossing areas 44 and 45 are obtained according to (Formula 3) using an inverse matrix thereof.

$$\begin{pmatrix} F(x_i, y) \\ F(x_j, y) \end{pmatrix} = \begin{pmatrix} W(a, x_i, y) & W(a, x_j, y) \\ W(b, x_i, y) & W(b, x_j, y) \end{pmatrix}^{-1} \begin{pmatrix} S(a, y) \\ S(b, y) \end{pmatrix} \quad \text{(Formula 3)}$$

$$= \frac{1}{|W|} \begin{pmatrix} W(b, x_j, y) & -W(a, x_j, y) \\ -W(b, x_i, y) & W(a, x_i, y) \end{pmatrix} \begin{pmatrix} S(a, y) \\ S(b, y) \end{pmatrix}$$

where, $|W| = W(a, x_i, y)W(b, x_j, y) - W(a, x_j, y)W(b, x_i, y)$

As described above, using the distribution of sensitivity W of the respective RF coils 22 and 23, the one-dimensional image calculated from the echoes $35_{22}$, $35_{23}$ obtained by the respective RF coils 22 and 23 can be separated into one-dimensional images (signal intensities) of the respective crossing areas 44 and 45.

The sensitivity distributions of the respective RF coils 22 and 23 are calculated using the following method or the like. For example, a plurality of images with different excitation intensities are acquired using a general imaging pulse sequence and the sensitivities of the respective RF coils 22 and 23 are calculated. In this case, since sensitivities of the RF coils 22 and 23 often change spatially smoothly, it is possible to shorten the measurement time and suppress body movement artifacts by only acquiring a low-frequency area. When, for example, the RF coil 21 belonging to the RF pulse application section has a spatially uniform sensitivity distribution, the sensitivity distributions of the respective RF coils 22 and 23 are calculated from the difference in intensity between the image obtained using the RF coil 21 for transmission and reception and the image obtained using the RF coil 21 for transmission and the RF coils 22 and 23 for reception. For example, it is also possible to acquire data using the conventional line scan method and assume the ratio of the measurement signals acquired using the respective RF coils 22 and 23 as the sensitivity distribution. In this case, since sensitivities of the RF coils 22 and 23 often change spatially smoothly, by selectively measuring lines instead of measuring all lines, it is possible to shorten the measurement time and suppress body movement artifacts. Since the sensitivity distribution depends on the structure and composition of the measuring object, it is preferable to perform measurement to calculate the sensitivity distribution using the actual measuring object. However, it is also possible to perform preliminary measurement using a dummy sample (phantom), calculate the sensitivity distribution and save the result in the data processing apparatus 20 and use the result.

Since this embodiment uses the difference in the sensitivity distribution of the RF coils 22 and 23 to separate signals from both crossing areas 44 and 45, the crossing areas 44 and 45 (coordinates $(x_i, y)$ and $(x_j, y)$ to be measured simultaneously) of the measuring object need to be arranged so as to produce a sensitivity difference in the RF coils 22 and 23. That is, it is important in above described (Formula 3) that the determinant of the sensitivity matrix A never become 0. The sensitivity distribution of a loop coil generally monotonously decreases in accordance with the distance from the center of the loop with respect to the direction horizontal to the loop plane. On the other hand, the sensitivity distribution of a loop coil monotonously decreases in accordance with the distance from the loop plane with respect to the direction perpendicular to the loop plane. In this embodiment, the crossing areas 44 and 45 of the measuring object are areas where x coordinates on the slice plane 43 parallel to the xy plane are different. That is, they are arranged in an array form in the x direction. Therefore, the RF coils 22 and 23 are arranged so that the ratio of the distances from two points spaced apart in the x direction to the centers of the respective RF coils 22 and 23 differs. As an example, this embodiment arranges the RF coils 22 and 23 so that their loop planes cross the slices 41 and 42 at right angles and in an array form in the direction of the normal to the slices 41 and 42. Here, the RF coils 22 and 23 are arranged in an array form in the x direction by placing their loop planes parallel to the xz plane. Here, a typical example is shown and it is acceptable if only the loop planes are not parallel to the slices 41 and 42 and the direction in which the RF coils 22 and 23 are arranged in an array form is not a direction perpendicular to the direction of the normal.

Figure 6:
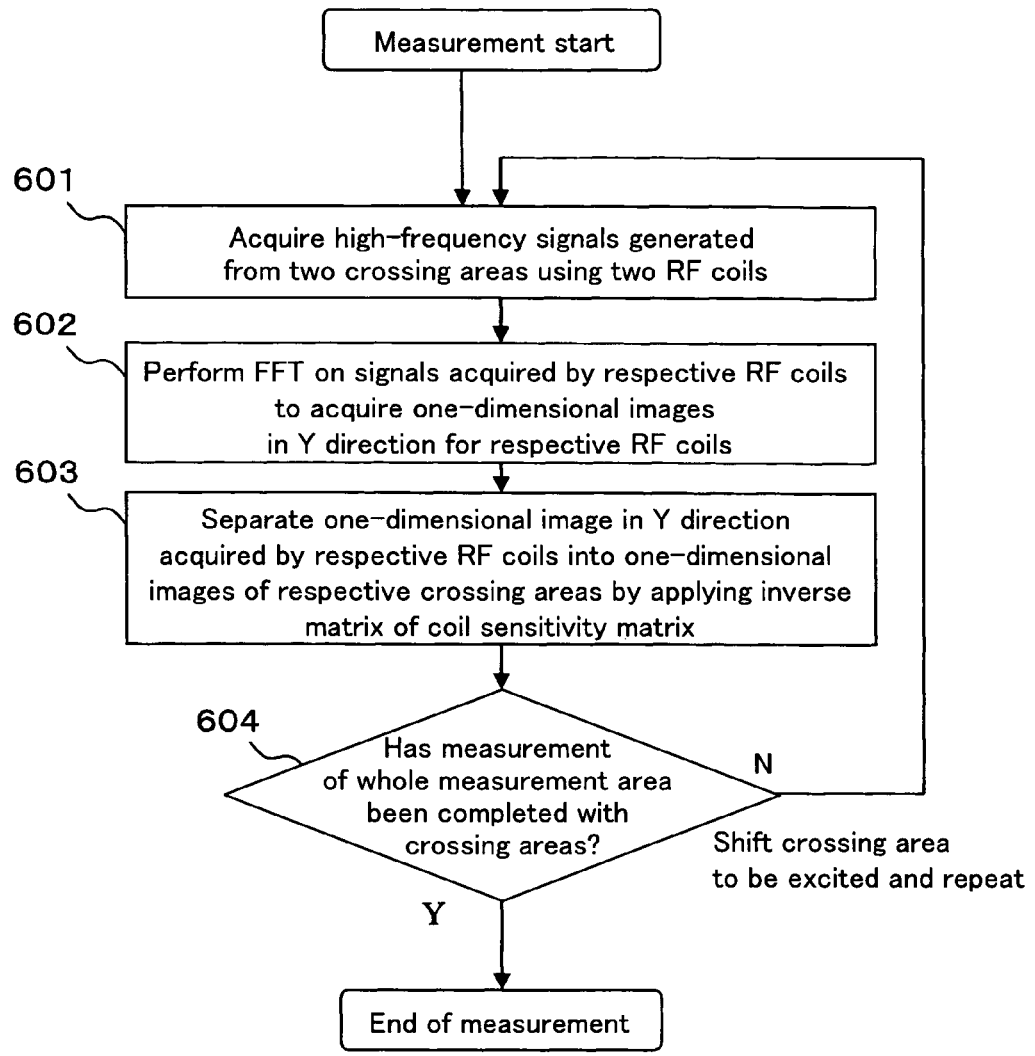
FIG. 6 is a processing flow of measurement and image reconstruction of the first embodiment.

Next, the procedure for measurement and image reconstruction by the MRI system 100 of this embodiment will be explained. FIG. 6 is a processing flow of this embodiment.

The control apparatus 14 operates the RF pulse application section, signal detection section and gradient magnetic field application section according to an imaging pulse sequence and acquires magnetic resonance signals generated from the two crossing areas 44 and 45 by the two RF coils 22 and 23 (step 601). Next, the control apparatus 14 causes the calculation section to perform an inverse Fourier transform on the magnetic resonance signals (echoes $35_{22}$, $35_{23}$) from the two linear crossing areas 44 and 45 acquired by the RF coils 22 and 23 (step 602). In this way, the magnetic resonance signals (echoes $35_{22}$, $35_{23}$) acquired by the respective RF coils 22 and 23 are converted into a one-dimensional image in the y direction. However, the measurement signals from the crossing areas 44 and 45 are mixed with this one-dimensional image. Next, the control apparatus 14 causes the calculation section to separate the one-dimensional image with which the measurement signals from both the crossing areas 44 and 45 are mixed into one-dimensional images of the crossing areas 44 and 45 using the sensitivity distributions of the respective RF coils 22 and 23 (step 603).

The control apparatus 14 repeats the above described processes in steps 601 to 603 while shifting the crossing areas 44 and 45 to be excited until measurement of the entire measurement area is completed (step 604) and acquires a two-dimensional image (image of the xy plane). The crossing areas 44 and 45 to be excited are shifted by changing the frequency fn of the first RF pulse 31. For example, the frequency (initial frequency) applied at the first measurement of the first RF pulse 31 is increased by $\Delta f$ for each measurement and excitation frequency fn is changed in a stepped fashion. That is, the frequency fn of the first RF pulse 31 at kth measurement is expressed as $fn = fn0 + k \cdot \Delta f$ (where, fn0 is an initial frequency, k is the number of measurements and $\Delta f$ is an increment). By changing the excitation frequency in this way, it is possible to move the slice planes 41 and 42 to be excited in the x direction and consequently move the crossing area 44 and 45 in the x direction. The increment $\Delta f$ when the inside of one slice plane is thoroughly measured is 2/C (C is a period (sec) of sinc waveform before modulation). Furthermore, there is a relationship $Xw = 4\pi/(\gamma \cdot Gsx \cdot C)$ ($\gamma$ is a gyromagnetic ratio, Gsx is an amplitude (T/m) of the gradient magnetic field 32) between the thickness Xw of the slice planes 41 and 42 and C.

The conventional line scan method requires the number of repetitions equal to the width of measurement area divided by the width of the linear area, since the number of crossing area is one. On the other hand, this embodiment can obtain signals of two crossing areas simultaneously, and can thereby reduce the number of repetitions. Especially when the distance between the linear areas 44 and 45 which are two crossing areas is set to half the field of view (FOV), the number of repetitions is reduced to half the conventional one and the measurement time is thereby reduced by half.

Therefore, according to this embodiment, it is possible to realize fast imaging at a speed of a maximum of 2 times the speed of conventional line scan whereby one line where two planes cross each other is scanned. More specifically, when it is assumed, for example, that the field of view is 256 mm, resolution is 2 mm, the number of pixels is 128 and the time required for one line measurement is 1 s, the method of this embodiment can reduce the measurement time to 64 seconds while measurement by conventional single line scan would require 128 seconds.

Since this embodiment uses no phase encoding gradient magnetic field as in the case of conventional line scan, the effect of suppressing body movement artifacts is maintained in this way. Moreover, since movement of the measuring object during measurement is reduced by shortening of the measurement time, it is possible to suppress body movement artifacts all the more. Especially this embodiment performs separation processing while measuring crossing areas, and can thereby further shorten the time required for image reconstruction. Furthermore, the SN ratio can also be improved by using a surplus time produced by speed enhancement for additions of signals.

Furthermore, since measurement signals from a plurality of crossing areas are separated using sensitivity distributions of a plurality of RF coils, it is possible not only to shorten the measurement time but also to suppress mixing of spatial errors.

Furthermore, when shifting the crossing areas 44 and 45, this embodiment shifts the inside of the slice plane 43 excited by the preceding second excitation pulse. For this reason, it is possible to shift the crossing areas without waiting for the magnetization of the slice plane 43 to recover sufficiently and continue measurement and thereby more easily acquire an image with T1 weighting.

This embodiment has explained the case where both the number of crossing areas and the number of RF coils are two as an example. However, these numbers are not limited to two.

For example, this embodiment excites two planes by the first excitation pulse and excites one plane by the second excitation pulse, and thereby measures the two crossing areas simultaneously and then performs separation processing. By extending this, it is also possible to increase the number of RF coils to three and increase the number of planes excited by the first excitation pulse to three. To increase the number of excitation planes to three, the waveform resulting from adding up, for example, the sinc waveform and cosine-modulated sinc waveform expressed by (Formula 1) may be used as the first RF pulse. In this case, the separation processing of three crossing areas requires a calculation of an inverse matrix of 3 rows and 3 columns. Even in the case of three or more dimensions, this can be solved using a general solution such as LU decomposition. Furthermore, the number of RF coils may be greater than the number of planes excited by the first excitation pulse. For example, the number of RF coil is set to three and the number of planes excited by the first excitation pulse is set to two. In this case, the sensitivity matrix becomes a matrix of 2 rows and 3 columns. This can be solved using a general solution of a matrix, that is, by normalizing the matrix, transforming the matrix into a regular matrix of 2 rows and 2 columns and calculating an inverse matrix thereof.

In this way, the measurement method for two or three crossing areas can be extended to process four or more crossing areas and by increasing the number of crossing areas where signals can be simultaneously measured, it is possible to realize speed enhancement all the more. However, to provide the sensitivity matrix A with an inverse matrix, the number of crossing areas needs to be set to the number of RF coils or less. This makes it possible to reduce errors to be mixed in when separating and calculating measurement signals using sensitivity distributions of a plurality of RF coils. Furthermore, when the value of the determinant of the sensitivity matrix A is small, noise mixed into the magnetic resonance signals is likely to be amplified and more artifacts accompanying errors in separation and calculation are likely to occur. Therefore, the first excitation pulse and the second excitation pulse need to be controlled so that crossing areas are set at positions at which differences in sensitivity distribution of the plurality of RF coils become as large as possible.

Furthermore, this embodiment has explained the case where the first RF pulse 31 is a 90-degree pulse and the second RF pulse 33 is a 180-degree pulse in an imaging pulse sequence as an example. However, the second RF pulse to excite the slice plane 43 may be a 90-degree pulse, ahead timewise and then the first RF pulse to excite the slice planes 41 and 42 may be set to a 180-degree pulse. That is, any one of the first RF pulse 31 and the second RF pulse 33 is set to a 90-degree pulse and the other is set to a 180-degree pulse. Combining 90-degree and 180-degree pulses can increase the intensity of the magnetic resonance signal. Furthermore, the frequency fm of the second RF pulse 33 may be changed so as to also scan in the z direction and acquire a three-dimensional image.

This embodiment moves the slice plane to change and excite the frequency fn, but it is also possible to continuously change the phase of the first RF pulse timewise during the application of the first excitation pulse and move the slice plane. When the frequency fn is changed, the width to be changed and the time may be restricted to maintain continuity of the phase. For example, depending on the specification of the synthesizer 16, when the frequency fn is changed, it is necessary to wait for a 1/(frequency shift) time after receiving an instruction for changing the frequency until the same phase is obtained next time. More specifically, changing the frequency by 100 Hz requires a wait time of a maximum of 10 ms. However, such a waiting time is eliminated if the phase is changed timewise continuously.

Moreover, the distance between the two lines may be set to half the field of view or less, only the area where the measuring object 10 exists may be redundantly measured as both the crossing areas 44 and 45 so as to increase the SN ratio of this area. Furthermore, the distance between both crossing areas may be set to (n+0.5) times (n is an integer) the width of the crossing areas so that the two crossing areas are shifted by half the width of the crossing areas, the whole field of view may be scanned by moving the crossing area 44 so that the whole field of view is scanned by shifting the crossing area 45 by half the width of the crossing areas. This makes it possible to improve the spatial resolution of the image acquired to half the width of the crossing area. For simplicity of explanation, suppose a one-dimensional image at the left end of the field of view is acquired by the crossing area 44 and a one-dimensional image at the position shifted rightward by a width half the crossing area from the left end of the field of view is acquired by the crossing area 45. Furthermore, suppose that there is a condition that there is no measuring object at the end of the field of view and the amount of signal is 0. At this time, the one-dimensional image at the left end having a half width takes the value of 0 and the one-dimensional image shifted rightward by a half width takes the value resulting from subtracting the one-dimensional image (that is, 0) at the left end having a half width from the one-dimensional image of the crossing area 44. The one-dimensional image shifted rightward by a half width is obtained by subtracting the previously calculated one-dimensional image on the left from the one-dimensional image of the crossing area 45. By successively calculating one-dimensional images having a half width of the crossing area in this way, a two-dimensional image is configured. As a result, it is possible to obtain an image whose spatial resolution is improved to a half width of the crossing area.

Figure 3:
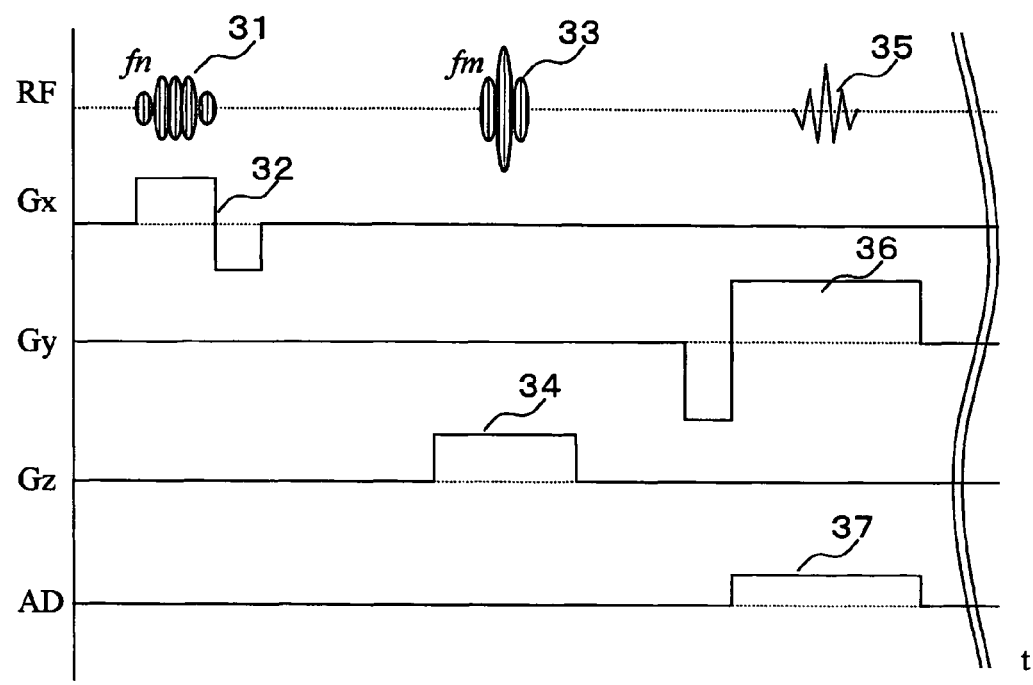
FIG. 3 illustrates an imaging pulse sequence and an RF pulse applied of the first embodiment.
Figure 3:
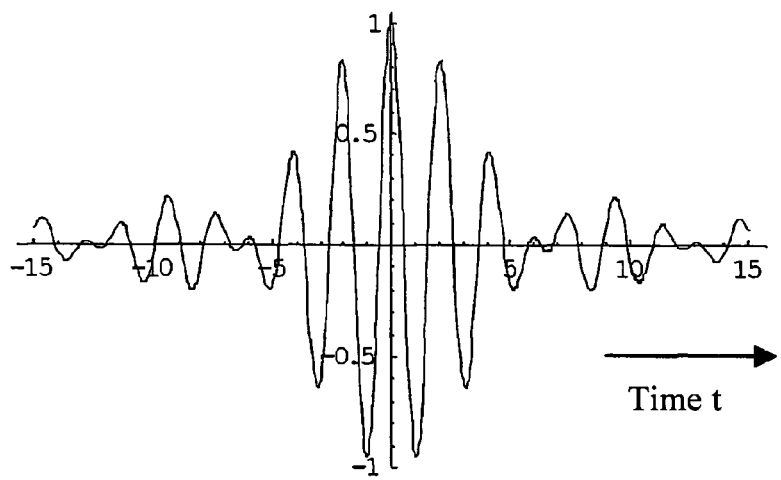
Figure 3:
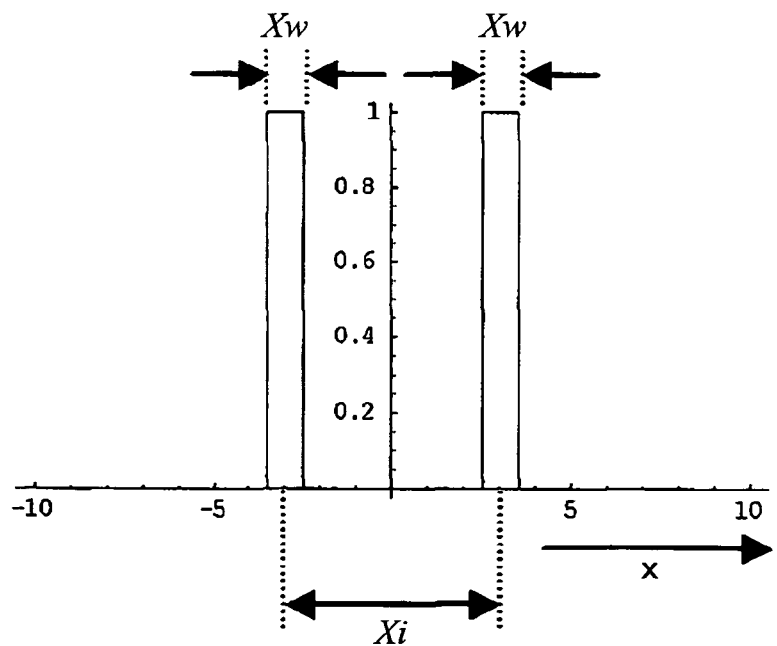

The pulse shape used for the first RF pulse 31 is not limited to the one shown in FIG. 3(*b*). For example, a waveform subjected to optimization such as decreasing intensities at both ends of the pulse to suppress ringing at the ends of the crossing areas 44 and 45 may also be used. Furthermore, as shown in (Formula 4), a sinc waveform whose amplitude is modulated with a sine waveform may also be used.

$$\frac{\mathrm{Sin}\left(\frac{a}{2}(Xi - Xw)t\right)}{t} + \frac{\mathrm{Sin}\left(\frac{a}{2}(Xi + Xw)t\right)}{t} \qquad \text{(Formula 4)}$$

Figure 7:
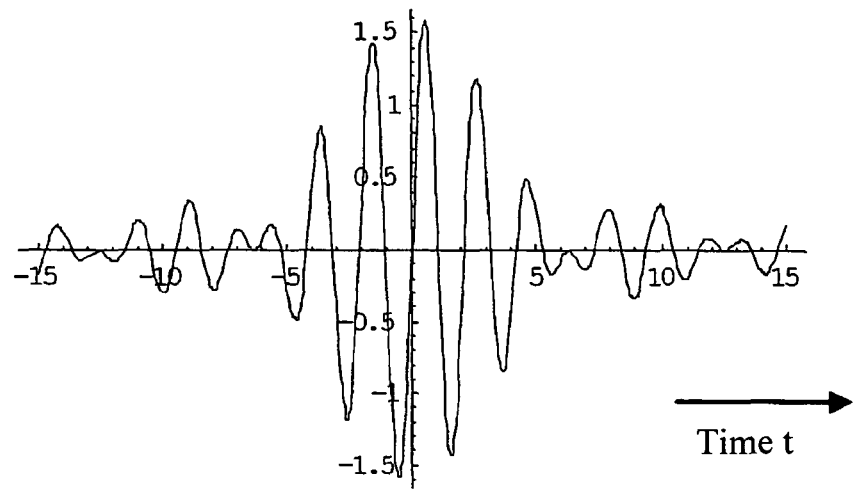
FIG. 7 illustrates another example of an RF pulse applied according to the first embodiment.
Figure 7:
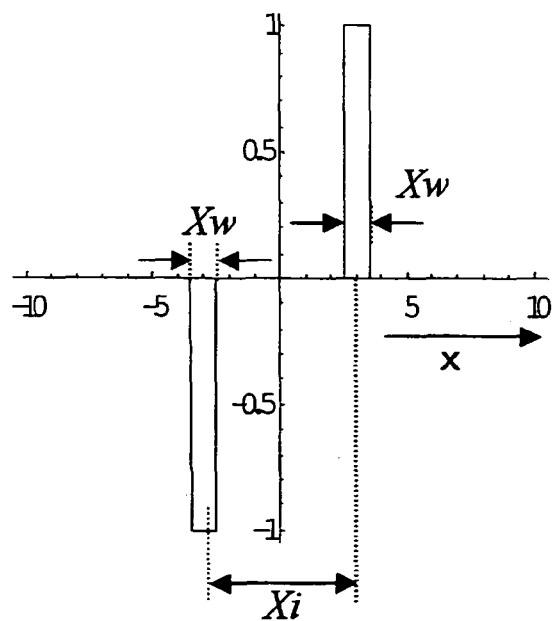
Figure 7:
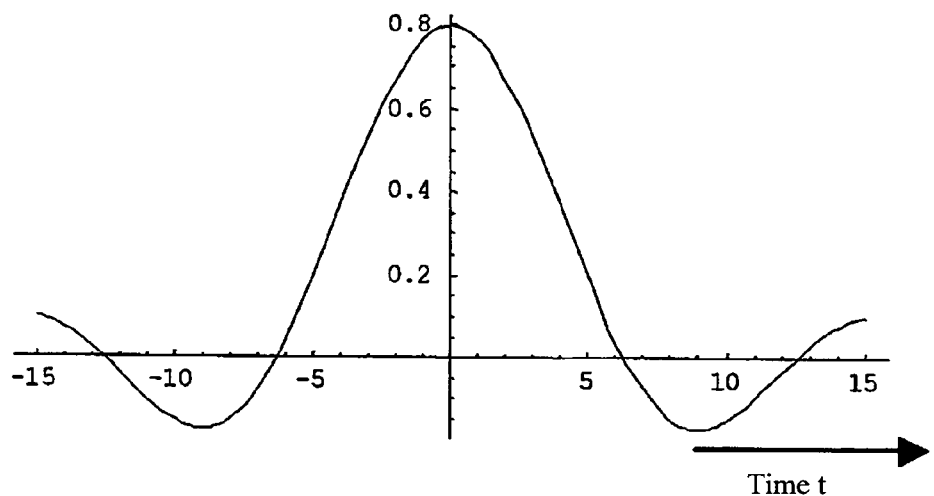
Figure 7:
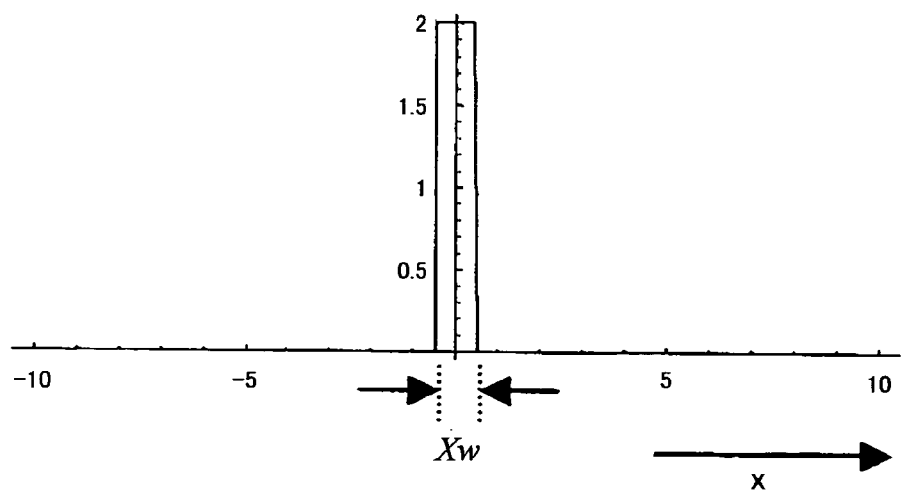

FIG. 7(*a*) shows this waveform. When this waveform is used, as shown in FIG. 7(*b*), excitation phases are inverted between the two excitation areas in a slice profile of the excitation area in the real space. When the excitation phases are the same, the signal intensity at the center of an echo of a magnetic resonance signal is the sum of the two, and therefore the reception gain needs to be decreased. On the other hand, when the excitation phases are inverted, the signal intensity at the center of an echo of a magnetic resonance signal corresponds to the difference between the two, and it is thereby possible to increase the reception gain and consequently expand the dynamic range. That is, waveform shapes of excitation pulses are set such that excitation phases of a plurality of substantially parallel planes excited by one or both of the first RF pulse 31 and second RF pulse 33 are alternately inverted. In this way, the maximum signal intensity is suppressed and the dynamic range of a magnetic resonance signal can be increased. Furthermore, instead of modulating the amplitude of the pulse shape, a sinc pulse having two frequencies of fn+α and fn−α may also be applied simultaneously as shown in (Formula 5).

$$\frac{\mathrm{Sin}\left(\frac{a}{2}Xw \cdot t\right)}{t} \qquad \text{(Formula 5)}$$

FIG. 7(*c*) shows the shape of a sinc pulse in this case and FIG. 7(*d*) shows a profile of the excitation area in the real space.

Second Embodiment

Next, a second embodiment will be explained. The MRI system of this embodiment basically has a configuration similar to that of the first embodiment. The first embodiment separates both signals using sensitivity distributions of the RF coils 22 and 23 every time measurement of the crossing areas 44 and 45 of the measuring object is completed and acquires a one-dimensional image of each crossing area. On the other hand, this embodiment saves the measurement result of each linear area in a memory or the like, separates images after completing measurement of the whole area of the measuring object and obtains a whole image. Furthermore, this embodiment acquires sensitivity distributions of the RF coils 22 and 23 during measurement of crossing areas 44 and 45. Hereinafter, details of this embodiment will be explained focusing on the configuration different from that of the first embodiment.

First, a technique of acquiring a sensitivity distribution according to this embodiment will be explained. For the sensitivity distribution, an intensity ratio of signals obtained by a single line scan is used. That is, measurement results S(a, y) and S(b, y) of the RF coils 22 and 23 of the crossing area ($L_i$, y) obtained by a single scan and sensitivities W(a, $L_i$, y) and W(b, $L_i$, y) of the respective RF coils 22 and 23 have a relationship in following (Formula 6).

$$\begin{pmatrix} S(a, y) \\ S(b, y) \end{pmatrix} = \begin{pmatrix} W(a, L_i, y) \\ W(b, L_i, y) \end{pmatrix} F(L_i, y) \qquad \text{(Formula 6)}$$

Here, $F(L_i, y)$ is a signal intensity of a crossing area ($L_i$, y). Therefore, the ratio of sensitivity W can be expressed by the ratio of measurement result S. This embodiment calculates the ratio of sensitivity W of a plurality of crossing areas ($L_i$, y) and calculates a distribution of the ratio of sensitivity W of the RF coils 22 and 23 in the x direction in the whole area by interpolation and extrapolation.

Figure 8:
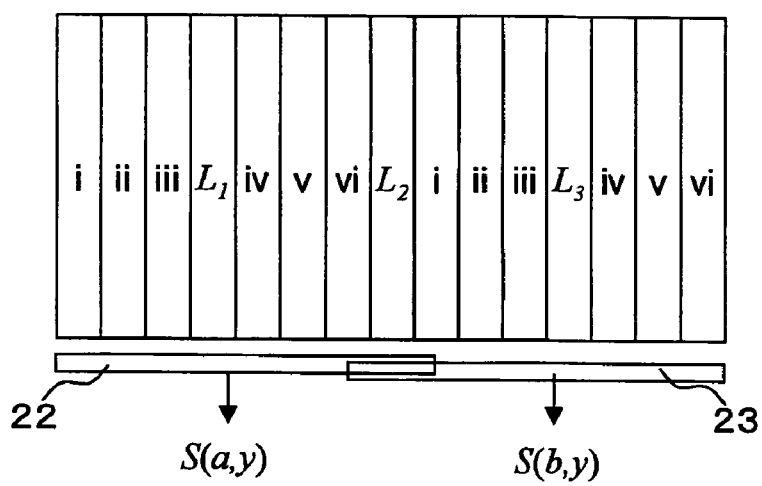
FIG. 8 illustrates a measurement procedure of a measurement area according to a second embodiment.

Next, a measuring procedure in a measurement area of this embodiment will be explained. FIG. 8 illustrates a measuring procedure in a measurement area of this embodiment. This embodiment performs a single-line scan measurement between measurements of crossing areas 44 and 45 (two-line scan measurements) and obtains sensitivity distributions of the RF coils 22 and 23 from the intensity ratio of signals obtained by the single-line scan measurement. In this figure, areas (i to vi) are crossing areas measured by two-line scan measurements. Areas of the same reference numerals are areas measured as the crossing areas 44 and 45. Furthermore, areas ($L_1$, $L_2$, $L_3$) are areas measured by single-line scan measurements. In this way, this embodiment shifts the crossing areas 44 and 45 to be excited while carrying out two-line scan measurements and performs single-line scan measurements when the crossing areas come to positions $L_1$, $L_2$ and $L_3$. As described above, the distribution of sensitivity W of the whole measurement area is calculated from the ratio of sensitivity W acquired in the respective areas $L_1$, $L_2$ and $L_3$ by interpolation or extrapolation. Therefore, the areas $L_1$, $L_2$ and $L_3$ thoroughly represent the whole measurement area and are selected from places where there is a high possibility of existence of the measuring object. Furthermore, the distance between the respective areas is selected in such a way that errors in unmeasured areas do not increase.

Figure 9:
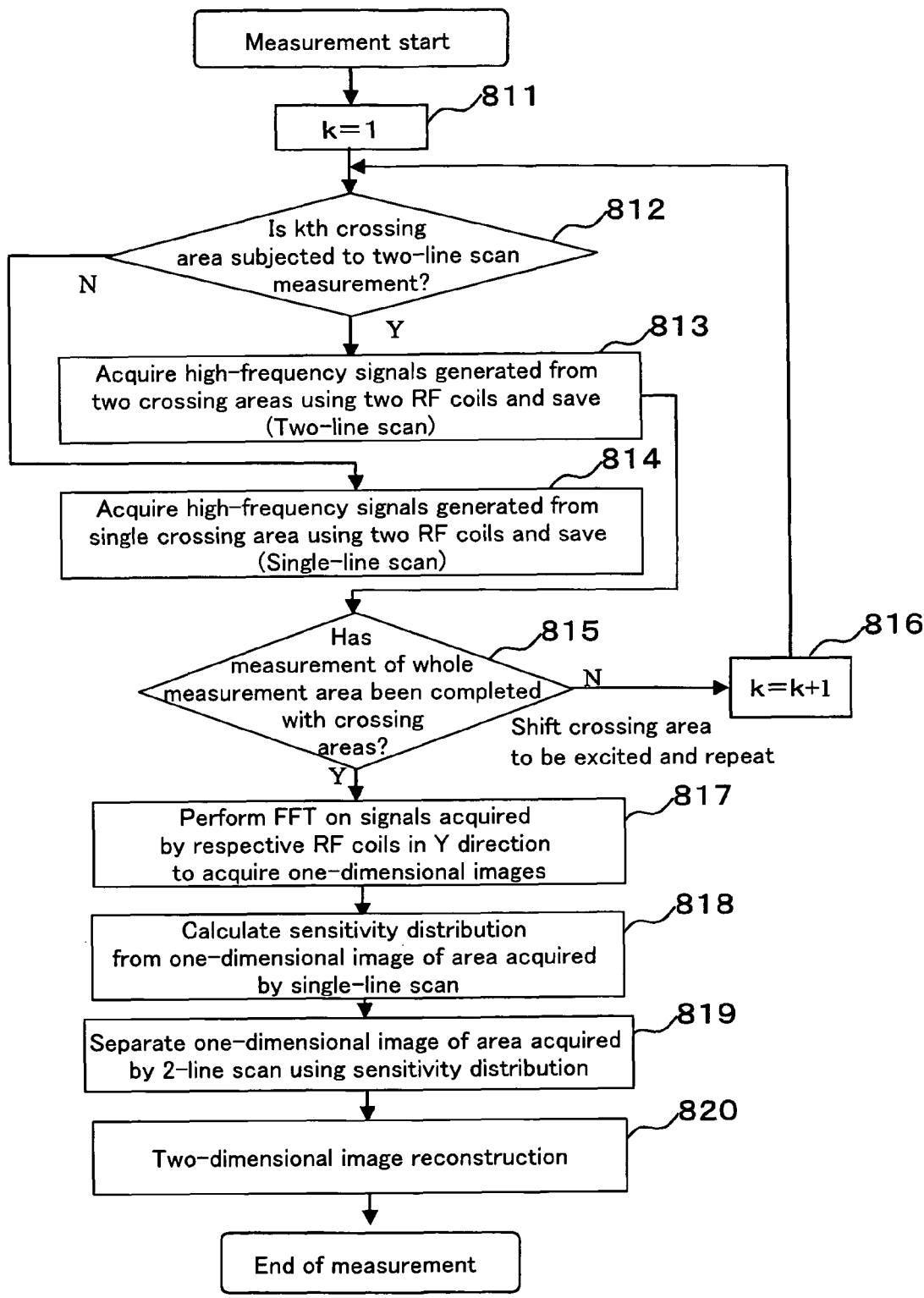
FIG. 9 is a processing flow of measurement and image reconstruction of the second embodiment.

Next, a procedure for measurement and image reconstruction by the MRI system 100 of this embodiment will be explained. FIG. 9 is a flow illustrating measurement processing of this embodiment.

The control apparatus 14 operates the RF pulse application section, signal detection section and gradient magnetic field application section according to an imaging pulse sequence and acquires magnetic resonance signals generated from the two crossing areas 44 and 45 by the two RF coils 22 and 23 (step 813). The acquired magnetic resonance signals are saved in a memory (not shown) or the like of the data processing apparatus 20. Measurement is repeated while shifting the crossing areas 44 and 45 to be excited using a technique similar to that of the first embodiment until the measurement in the area of the measuring object is completed (steps 811 to 816). In this case, in this embodiment, when measuring the areas (i to vi) shown in FIG. 8, the control apparatus 14 performs two-line scan measurements whereby the two crossing areas 44 and 45 are measured simultaneously and controls, when measuring $L_1$, $L_2$ and $L_3$, the respective sections so as to perform conventional single-line scan measurements (step 812). In the example of FIG. 8, the crossing area 44 and 45 to be excited are shifted, areas i to iii are measured by two-line scan measurements, and then areas $L_1$ and $L_3$ are measured in that order by single-line scan measurements and then areas iv to vi are measured by two-line scan measurements and finally $L_2$ is measured by a single-line scan measurement.

When measurements in the whole measurement area are completed, the control apparatus 14 causes the calculation section to perform an inverse Fourier transform on the magnetic resonance signals acquired from the RF coils 22 and 23 (magnetic resonance signals from the areas i to vi, $L_1$, $L_2$, $L_3$) in the y direction and thereby calculate a one-dimensional image in the y direction (step 817).

Next, the control apparatus 14 causes the calculation section to create a distribution map of the ratio of sensitivity W of the RF coils 22 and 23 in the x direction of the whole measurement area from the measurement results of the RF coils 22 and 23 of the areas $L_1$, $L_2$, $L_3$ obtained by single-line scans (step 818).

The control apparatus 14 causes the calculation section to use the distribution map of the ratio of sensitivity W obtained in step 814 and separate one-dimensional images of areas i to vi in which signals of the crossing areas 44 and 45 are mixed into one-dimensional images of the crossing areas 44 and 45 as in the case of the first embodiment (step 819).

The control apparatus 14 causes the calculation section to combine one-dimensional images of the respective crossing areas i to vi after separation and one-dimensional images calculated from $L_1$, $L_2$, $L_3$ acquired by single-line scans and reconstruct a two-dimensional image (step 820).

As explained so far, this embodiment performs a single-line scan measurement during intervals between two-line scan measurements, and can thereby obtain a distribution map of (the ratio of) sensitivity W during measurement. Therefore, this embodiment can not only obtain more accurate sensitivity distributions but also shorten the time required for a whole measurement compared with a case where a measurement for acquiring a sensitivity distribution is performed separately.

Figure 10:
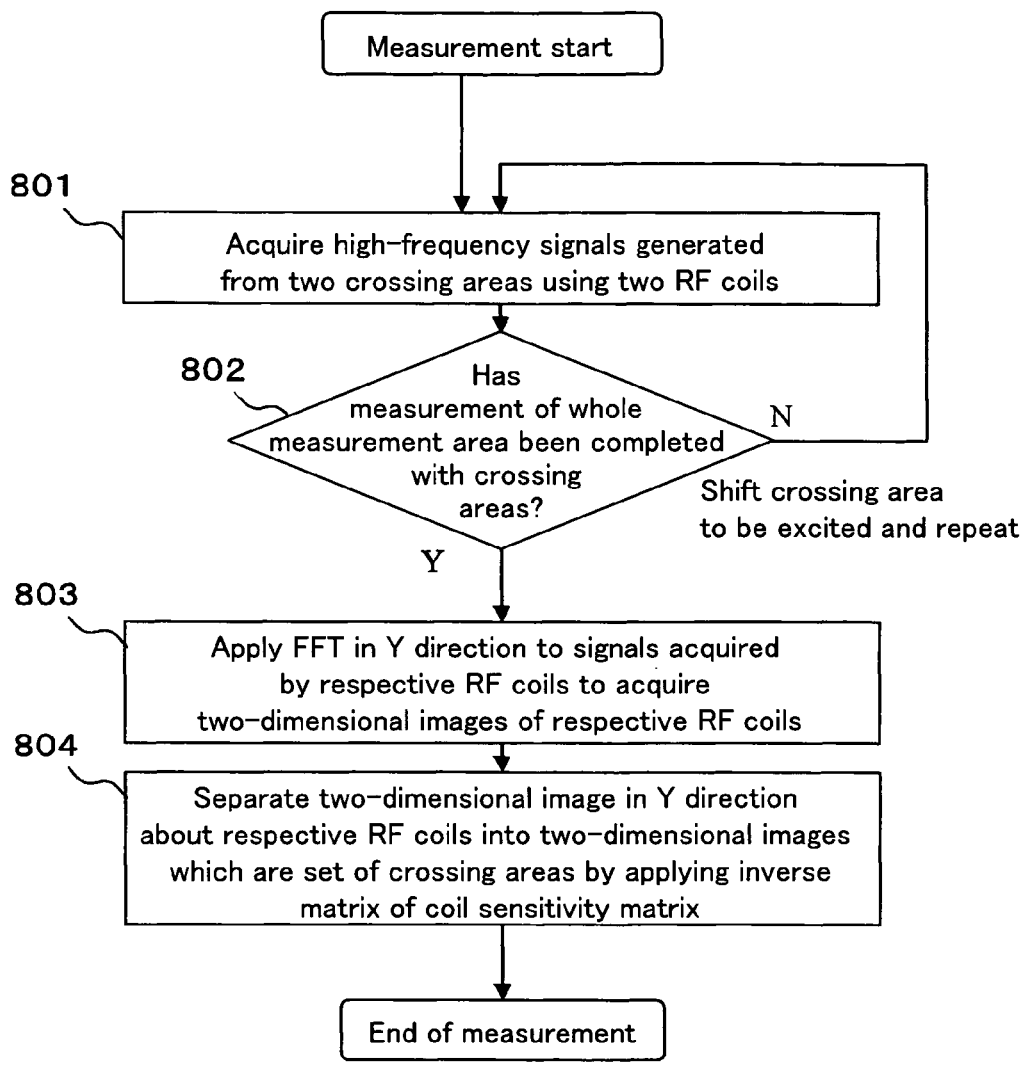
FIG. 10 is another processing flow of measurement and image reconstruction of the second embodiment.

Measurement may also be performed using sensitivity distributions acquired beforehand in this embodiment. FIG. 10 shows a processing flow under the control of the control apparatus 14. As shown in this figure, the two RF coils 22 and 23 acquire magnetic resonance signals generated from the two crossing area 44 and 45 (step 801). The magnetic resonance signals acquired are saved in the memory or the like of the data processing apparatus 20. Measurement is repeated using a technique similar to that of the first embodiment while shifting the linear areas 44 and 45 to be excited until measurement of the whole area of the measuring object is completed (step 802).

Next, an inverse Fourier transform in the y direction is applied to the respective saved magnetic resonance signals and two-dimensional images of the respective RF coils 22 and 23 are thereby calculated (step 803).

The measurement signals of the crossing areas 44 and 45 acquired simultaneously are mixed in the two-dimensional images obtained here. Therefore, processing of separating these signals is performed and an image is reconstructed (step 804). As in the case of the first embodiment, this embodiment also uses sensitivity distributions of the RF coils 22 and 23 to separate the image into a two-dimensional image by the magnetic resonance signal obtained from the crossing area 44 side and a two-dimensional image by the magnetic resonance signal obtained from the crossing area 45. On the two-dimensional images, separation processing is performed using sensitivity distributions. Therefore, an algorithm used for a conventional SENSE method can be applied to the separation processing. Furthermore, this embodiment may be adapted so as to perform the process in step 803 immediately after step 801, and the process of image reconstruction after measurement is only performed in step 804 and it is thereby possible to shorten the processing time. That is, after a magnetic resonance signal is acquired, the signal is subjected to an inverse Fourier transform in the y direction, stored in a memory and the processing is repeated for the whole measurement area.

Third Embodiment

Next, a third embodiment will be explained. The MRI system of this embodiment basically has a configuration similar to that of the first embodiment. The first embodiment changes the frequency fn of the first excitation pulse and moves the crossing area to be excited by the second excitation pulse in the slice plane. This embodiment changes the frequency fn of the first excitation pulse and moves the crossing area out of the excitation plane to be excited by the second excitation pulse applied immediately before. Hereinafter, details of this embodiment will be explained focusing on the configuration different from that of the first embodiment.

First, a method of acquiring echoes by the RF pulse application section, signal detection section, gradient magnetic field application section of this embodiment and the echoes acquired will be explained. In this embodiment, the control apparatus 14 also controls these sections according to programmed timings (imaging pulse sequence). Hereinafter, operations of the respective sections will be explained according to the imaging pulse sequence of this embodiment.

Figure 11:
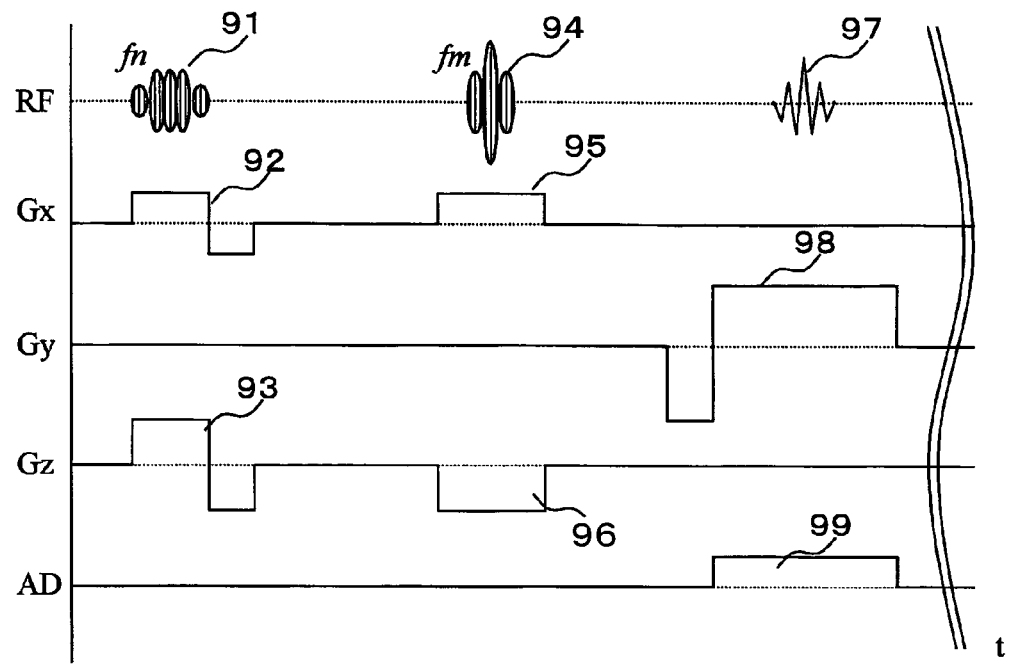
FIG. 11 is an imaging pulse sequence according to a third embodiment.
Figure 12:
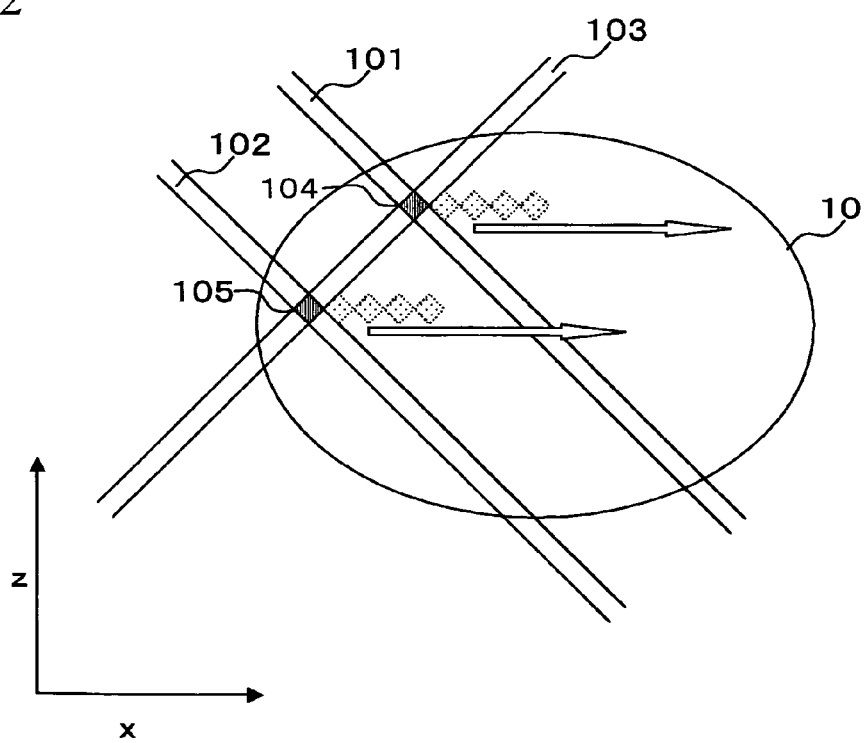
FIG. 12 is a schematic view of an area excited by the imaging pulse sequence according to the third embodiment.

FIG. 11 is an imaging pulse sequence diagram of this embodiment. Here, the horizontal axis shows time (t) and the vertical axis shows a high-frequency electromagnetic field RF applied by the RF pulse application section, gradient magnetic fields Gx, Gy and Gz applied by the gradient magnetic field application section, and their respective operation timings and intensities are indicated. AD denotes a period during which data is acquired by the signal detection section. Furthermore, FIG. 12 illustrates an area excited by the imaging pulse sequence of this embodiment. Here, this embodiment will be explained using the xz plane.

Together with application of a slice gradient magnetic field 92 in the x direction and a slice gradient magnetic field 93 in the z direction, a first RF pulse 91 having two excitation planes at a frequency fn is applied and a nuclear magnetic resonance phenomenon is induced in two slices 101 and 102 shown in FIG. 12. Here, as in the case of the first embodiment, a pulse obtained by modulating a sin waveform with a continuous periodic function waveform and setting amplitude to 90 degrees is used for the first RF pulse 91. Furthermore, also in this embodiment, the first RF pulse 91 and slice gradient magnetic fields 92 and 93 will be collectively called a "first excitation pulse" hereinafter for simplicity.

Next, a second RF pulse 94 having one excitation plane at a frequency fm is applied together with application of a slice gradient magnetic field 95 in the x direction and a slice gradient magnetic field 96 in the z direction and magnetization in a slice 103 in FIG. 12 is inverted. A pulse obtained by setting amplitude of a sinc waveform to 180 degrees is used for the second RF pulse 94 as in the case of the first embodiment.

Furthermore, the polarity of the slice gradient magnetic field 96 is opposite to the polarity of the slice gradient magnetic field 93. Here, the second RF pulse 94 and slice gradient magnetic fields 95 and 96 will also be collectively called a "second excitation pulse" hereinafter for simplicity.

Since the slice gradient magnetic fields 93 and 96 have mutually opposite polarities, the slices 101 and 102 excited by the first excitation pulse and the slice 103 excited by the second excitation pulse cross each other and echoes are generated from these crossing areas. The crossing areas are two linear areas 104 and 105. After that, while applying a read-out gradient magnetic field 98 in the y direction, an echo 97 which is a magnetic resonance signal from the crossing areas 104 and 105 is acquired as an AD 99. In this way, spatial information in the y direction is obtained. As described above, the magnetic resonance signals acquired by the RF coils 22 and 23 of the RF coil system 13 are sent to the signal detection section separately and processed.

In this embodiment, the control apparatus 14 also shifts the areas 104 and 105 to be excited and measures the whole measurement area. That is, the control apparatus 14 changes the frequency fn of the first RF pulse 91 and the frequency fm of the second RF pulse 94, thereby moves the slice planes 101, 102 and 103 in the x direction and consequently moves the crossing areas 104 and 105 in the x direction, that is, moves the crossing areas out of the slice plane 103. By repeating this, the control apparatus 14 acquires measurement signals of the whole area in predetermined two slices.

As in the case of the first embodiment, this embodiment also changes the frequency of the RF pulse in a stepped fashion and moves the crossing areas 104 and 105. Here, the frequency fn of the first RF pulse 91 and the frequency fm of the second RF pulse 94 are increased by $\Delta$fn and $\Delta$fm respectively for every measurement and the excitation frequency is changed in a stepped fashion. That is, the frequencies of the first RF pulse 91 and second RF pulse 94 at a kth measurement are expressed as fn=fn0+k·$\Delta$fn and fm=fm0+k·$\Delta$fm (here, fn0 and fm0 are initial frequencies, k is the number of measurements, $\Delta$fn and $\Delta$fm are increments respectively).

Furthermore, when the slice planes 101 and 102 have the same thickness as the slice plane 103 and cross each other at right angles, that is, when the planes of projection of the crossing areas 104 and 105 onto the xz plane are square, $\Delta$fn=4/C and $\Delta$fm=−4/C should be set so that the slices of the whole measurement area are scanned thoroughly without overlapping with each other. Here, C is the period (sec) of the sinc waveform before modulation as in the case of the first embodiment.

Here, the case where the frequencies fn and fm are changed and the linear crossing areas to acquire measurement signals are moved has been explained as an example. However, the technique of moving crossing areas is not limited to this. For example, as in the case of the first embodiment, the phases of the first RF pulse 91 and the second excitation pulse 94 may be changed temporally continuously during application of the first excitation pulse and the second excitation pulse and the slice planes 101, 102 and 103 may be moved. When the crossing areas are moved by temporally continuously changing the phase, a waiting time to maintain phase continuity becomes unnecessary.

In this embodiment, the calculation section also reconstructs an image from the echo 97 acquired by the above described imaging pulse sequence according to an instruction of the control apparatus 14. When reconstructing the image, this embodiment also separates the echo 97 in which magnetic resonance signals from the two crossing areas 104 and 105 are mixed into the signals of the respective areas. This embodiment can use any method of the first embodiment and the second embodiment to separate echoes and reconstruct an image. As in the case of the first and second embodiments, the RF coils 22 and 23 of this embodiment are arranged so that signals from both the crossing areas 104 and 105 can be separated.

As explained so far, this embodiment also acquires magnetic resonance signals from two crossing areas simultaneously, and thereby reduces the number of times line scan measurement necessary to reconstruct an image is repeated to half compared to the conventional case. Furthermore, the first and second embodiments shift the linear areas 44 and 45 in the slice plane 43 excited by the preceding second excitation pulse. Therefore, when T1 weighting is required to be reduced, a sufficiently long repletion time TR needs to be taken because the system waits for magnetization in the slice plane 43 to recover sufficiently. On the other hand, according to this embodiment, the direction in which the linear areas 104 and 105 are shifted is the direction of the area not excited by the preceding first and second excitation pulses. Therefore, a long repletion time TR need not be taken to wait for magnetization to recover and a sufficient signal intensity can be obtained in a short repletion time TR. When influences of the preceding measurement remain in neighboring areas due to incompleteness of the excitation profile, the sequence may be improved, for example, by shifting every few areas instead of successively shifting the linear areas 104 and 105 and the influences can thereby be removed.

As described above, this embodiment can set a short repetition time TR and can thereby further shorten the time for measuring the whole area necessary for image reconstruction. More specifically, if it is assumed that the field of view is 256 mm, resolution is 2 mm, the number of pixels is 128 and the time required for one line measurement is 100 ms, the conventional method requires 12.8 seconds per slice for acquisition. On the other hand, this embodiment can acquire two slices simultaneously, and can thereby perform measurement in 6.4 seconds per slice. This embodiment does not perform phase encoding either, and can thereby keep the amount of body movement artifacts at the low level that the line scan method originally achieves. Furthermore, since the measurement time is shortened, it is possible to reduce the probability that the measuring object may move during a measurement time and consequently further suppress body movement artifacts.

Fourth Embodiment

Next, a fourth embodiment will be explained. The MRI apparatus of this embodiment basically has a configuration similar to that of the first embodiment. The above described embodiments measure two linear crossing areas simultaneously. On the other hand, this embodiment measures four linear crossing areas simultaneously. Therefore, this embodiment differs from the above described embodiments in not only that an imaging pulse sequence can excite four linear areas simultaneously but also that the coil arrangement enables magnetic resonance signals from the four linear areas to be separated. Hereinafter, this embodiment will be explained focusing on the configuration different from that of the first embodiment.

First, the method of acquiring echoes by the RF pulse application section, signal detection section and gradient magnetic field application section of this embodiment and the echoes acquired will be explained. In this embodiment, the control apparatus 14 also controls these sections according to programmed timings (imaging pulse sequence). Hereinafter, operations of the respective sections will be explained according to an imaging pulse sequence of this embodiment.

Figure 13:
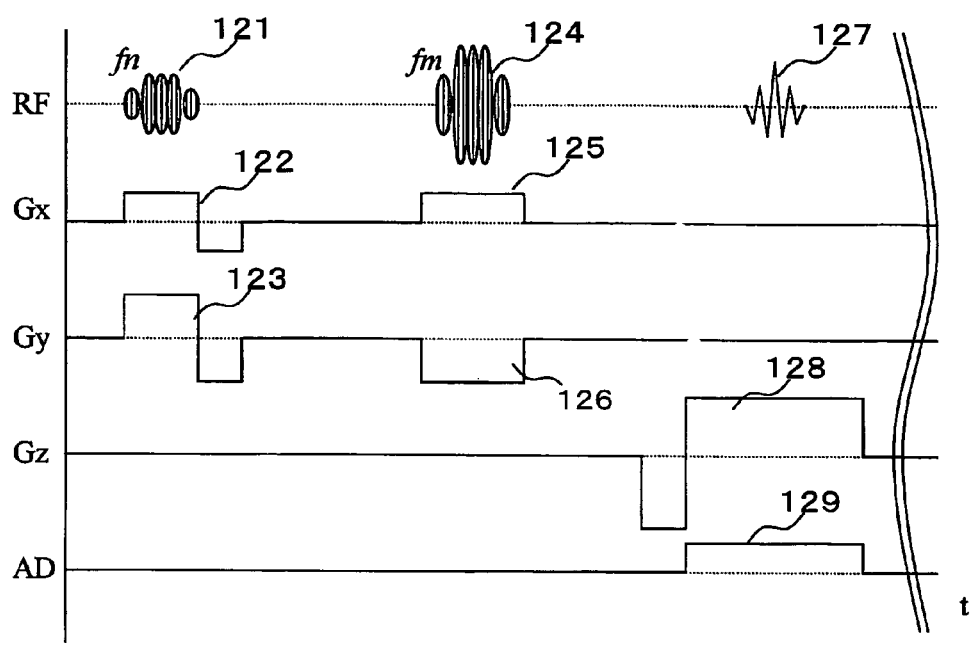
FIG. 13 is an imaging pulse sequence according to a fourth embodiment.
Figure 14:
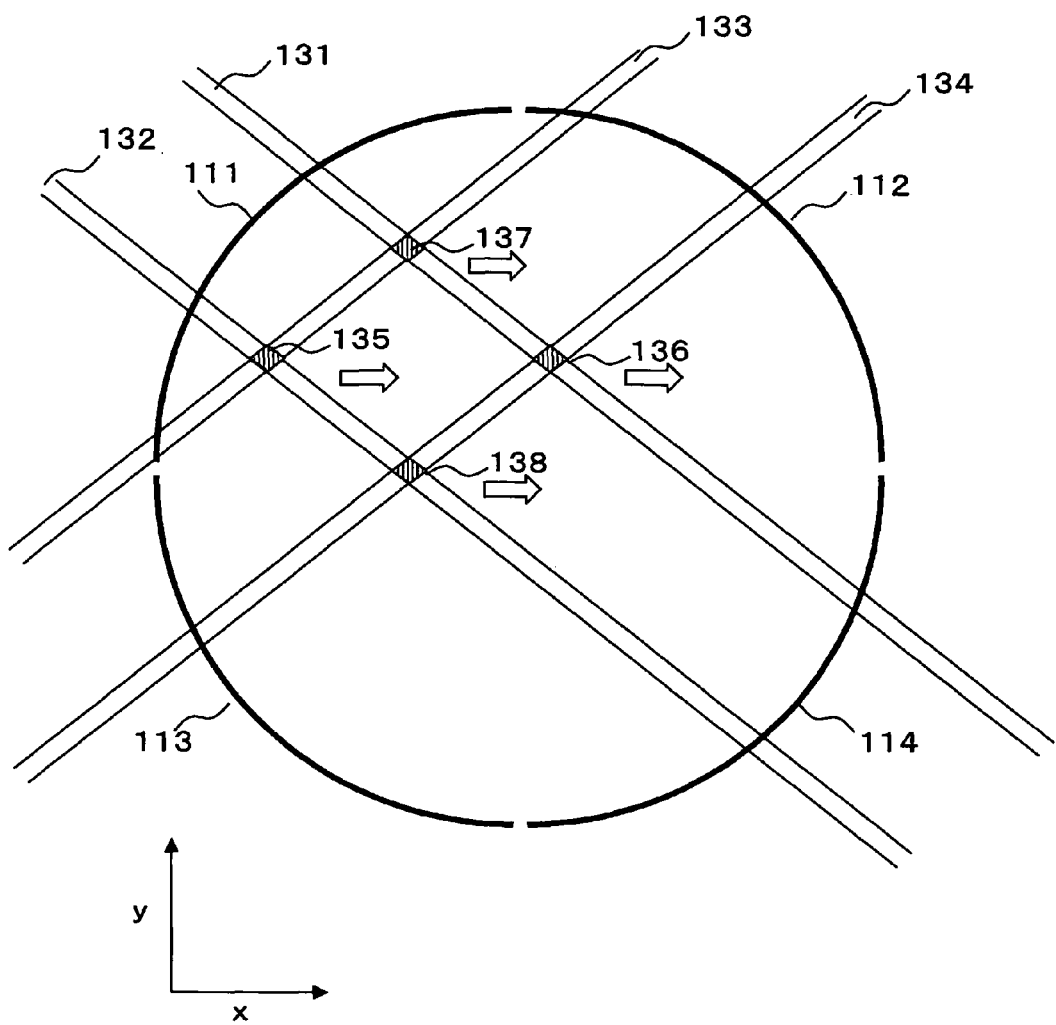
FIG. 14 is a schematic view of an area excited by the imaging pulse sequence of the fourth embodiment.

FIG. 13 shows an imaging pulse sequence of this embodiment. Here, the horizontal axis shows time (t), the vertical axis shows a high-frequency electromagnetic field RF and gradient magnetic fields Gx, Gy and Gz, and their respective operation timings and intensities are indicated. AD is a data acquisition period. FIG. 14 illustrates areas excited by the imaging pulse sequence of this embodiment. Here, this embodiment will be explained using the xz plane. In FIG. 14, reference numerals 111, 112, 113 and 114 denote RF coils making up a RF coil system 13. Details will be described later.

Together with application of a slice gradient magnetic field 122 in the x direction and a slice gradient magnetic field 123 in the y direction, a first RF pulse 121 having two excitation planes at a frequency fn is applied and a nuclear magnetic resonance phenomenon is induced in two slices 131 and 132 shown in FIG. 14. Here, as in the case of the first embodiment, a pulse obtained by modulating a sinc waveform with a continuous periodic function waveform and setting amplitude to 90 degrees is used for the first RF pulse 121. Furthermore, in this embodiment, the first RF pulse 121 and slice gradient magnetic fields 122 and 123 will also be collectively called a "first excitation pulse" hereinafter for simplicity.

Next, a second RF pulse 124 having two excitation planes at a frequency fm is applied together with application of a slice gradient magnetic field 125 in the x direction and a slice gradient magnetic field 126 in the y direction and magnetization in two slices 133 and 134 shown in FIG. 14 is inverted. A pulse obtained by modulating a sinc waveform with a periodic function waveform and setting amplitude to 180 degrees is used for the second RF pulse 124 as in the case of the first RF pulse 121. Furthermore, the polarity of a slice gradient magnetic field 126 is opposite to the polarity of the slice gradient magnetic field 123. Here, the second RF pulse 124 and slice gradient magnetic fields 125 and 126 will also be collectively called a "second excitation pulse" hereinafter for simplicity.

Since the slice gradient magnetic fields 123 and 126 have opposite polarities, the slices 131 and 132 excited by the first excitation pulse and the slices 133 and 134 excited by the second excitation pulse cross each other and echoes are generated from these crossing areas. The crossing areas are four linear areas 135, 136, 137 and 138.

After that, while applying a read-out gradient magnetic field 128 in the z direction, an echo 127 which is a magnetic resonance signal is acquired in a time period of AD 129. In this way, spatial information in the z direction is obtained. In this embodiment, the magnetic resonance signals acquired by the RF coils of the RF coil system 13 are also sent to the signal detection section separately and processed.

In this embodiment, the control apparatus 14 also changes the frequency fn of the first RF pulse 121 and the frequency fm of the second RF pulse 124, moves the slice planes 131, 132, 133 and 134 in the x direction and consequently moves the crossing areas 135, 136, 137 and 138 in the x direction. Furthermore, also in the y direction, the control apparatus 14 likewise changes the frequency fn of the first RF pulse 121 and the frequency fm of the second RF pulse 124, moves the respective slice planes and moves the respective crossing areas. By repeating this, measurement signals of the whole three-dimensional area are obtained.

As in the case of the third embodiment, this embodiment also increases the frequency fn of the first RF pulse 121 and the frequency fm of the second RF pulse 124 by $\Delta fn$ and $\Delta fm$ respectively for every measurement, changes the excitation frequency in a stepped fashion and moves the crossing areas 135, 136, 137 and 138. That is, the frequencies of the first RF pulse 121 and second RF pulse 124 at a kth measurement are expressed as $fn=fn0+k\cdot\Delta fn$ and $fm=fm0+k\cdot\Delta fm$ (here, $fn0$ and $fm0$ are initial frequencies, k is the number of measurements, $\Delta fn$ and $\Delta fm$ are increments respectively).

By moving the respective slice planes and moving the respective linear areas as shown above, measurement signals of the whole three-dimensional area are acquired and a three-dimensional image is reconstructed. The technique of image reconstruction in this embodiment is basically the same as that of the first to third embodiments. That is, according to an instruction of the control section 14, the calculation section separates the echo 127 acquired by the above imaging pulse sequence into signals from the respective crossing areas and reconstructs an image. However, the signals from the four crossing areas 135, 136, 137 and 138 need to be separated. For this reason, at least four RF coils for receiving the respective magnetic resonance signals are necessary and need to be arranged so that the inverse matrix of the sensitivity matrix A is not 0, that is, signals from the four crossing areas can be received with different sensitivities for the respective RF coils.

Figure 15:
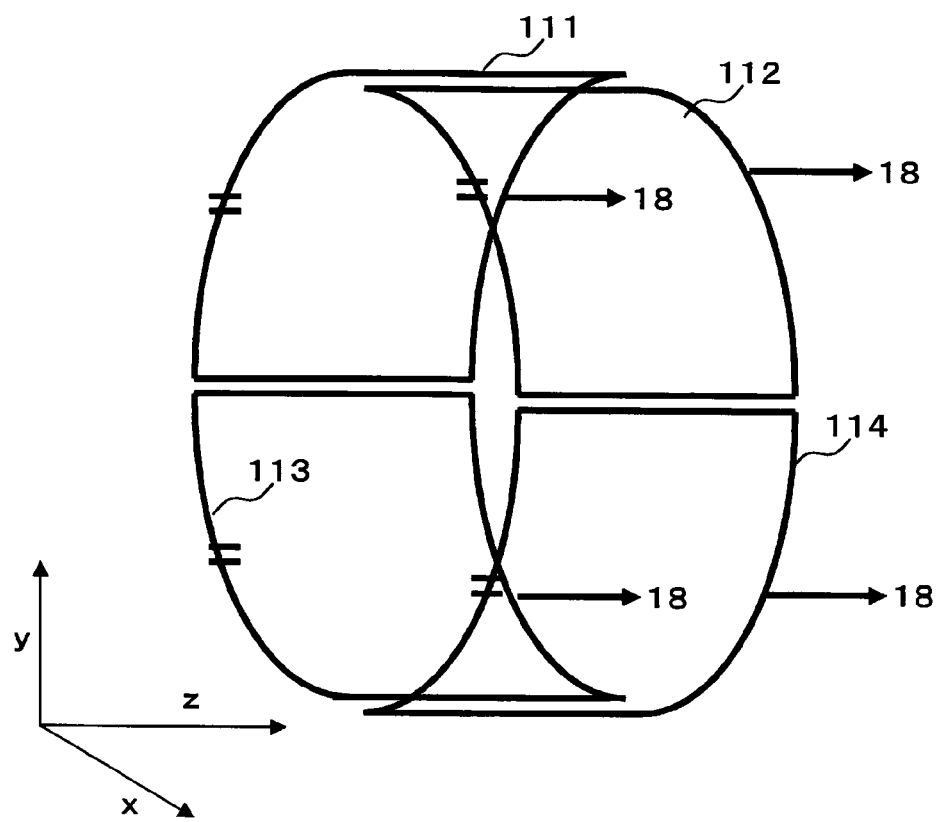
FIG. 15 is a configuration diagram of a RF coil system of the fourth embodiment.

FIG. 15 shows an example of the arrangement of the RF coils of the RF coil system 13 that satisfies the above described conditions. In this example, the four RF coils 111, 112, 113 and 114 are configured so as to each have a cross section of substantially ¼ segment of a circle on the xy plane and form a cylindrical shape as a whole. Each RF coil is individually connected to the amplifier 18 and a measured magnetic resonance signal is individually acquired. For simplicity, the RF coils for transmission and detuning circuits are omitted in this figure. Though the four RF coils are shown so as not to overlap each other in this example, the mutually neighboring RF coils are actually arranged so as to partially overlap each other on the cylindrical cross section. Of course, the number and the shape of RF coils are not limited to this and various modifications are possible as long as the RF coils can receive signals from the four crossing areas with different sensitivities.

As described above, since this embodiment needs to separate signals from the four crossing areas and the number of RF coils is also four, the sensitivity matrix obtained from sensitivity distributions of the respective RF coils is also a 4×4 matrix. Therefore, solutions used for an inverse matrix of a higher-order matrix such as LU decomposition and singular value decomposition are used for inverse matrix operations.

As explained so far, since this embodiment can simultaneously acquire magnetic resonance signals of four linear areas, the number of repetitions is ¼ of the conventional one and the whole measurement time is also reduced accordingly. The number of planes excited by the second excitation pulse may also be increased to three or more in this embodiment. The planes excited by the second excitation pulse are also a plurality of substantially parallel planes, the number of crossing areas increases and the rate of shortening of measurement time can be increased.

Furthermore, when compared to the first to third embodiments, this embodiment adopts an arrangement of RF coils specific to this embodiment and thereby increases the degree of freedom in setting a plurality of linear areas to be excited (line setting). For example, according to the first embodiment, the sensitivity difference between the RF coils is large only in the x direction, and therefore a plurality of crossing areas to be excited need to be set so as to be separated from each other in the x direction to make a sensitivity difference distinct when the crossing areas are separated. On the other hand, according to the above described arrangement of this embodiment, the sensitivity difference between the RF coils is large in both the x direction and y direction and the measurement signal can be separated even if a plurality of crossing areas are set separated apart in any direction.

As described above, this embodiment has a high degree of freedom in selecting crossing areas and also enables speed enhancement. However, even when only two-dimensional images are necessary, unnecessary measurement signals are acquired. Hereinafter, this embodiment will explain a technique of suppressing signals from two out of the four crossing areas. Since this embodiment is similar to the embodiment where signals are acquired from four crossing areas except in the imaging pulse sequence, only the imaging pulse sequence will be explained below.

Figure 16:
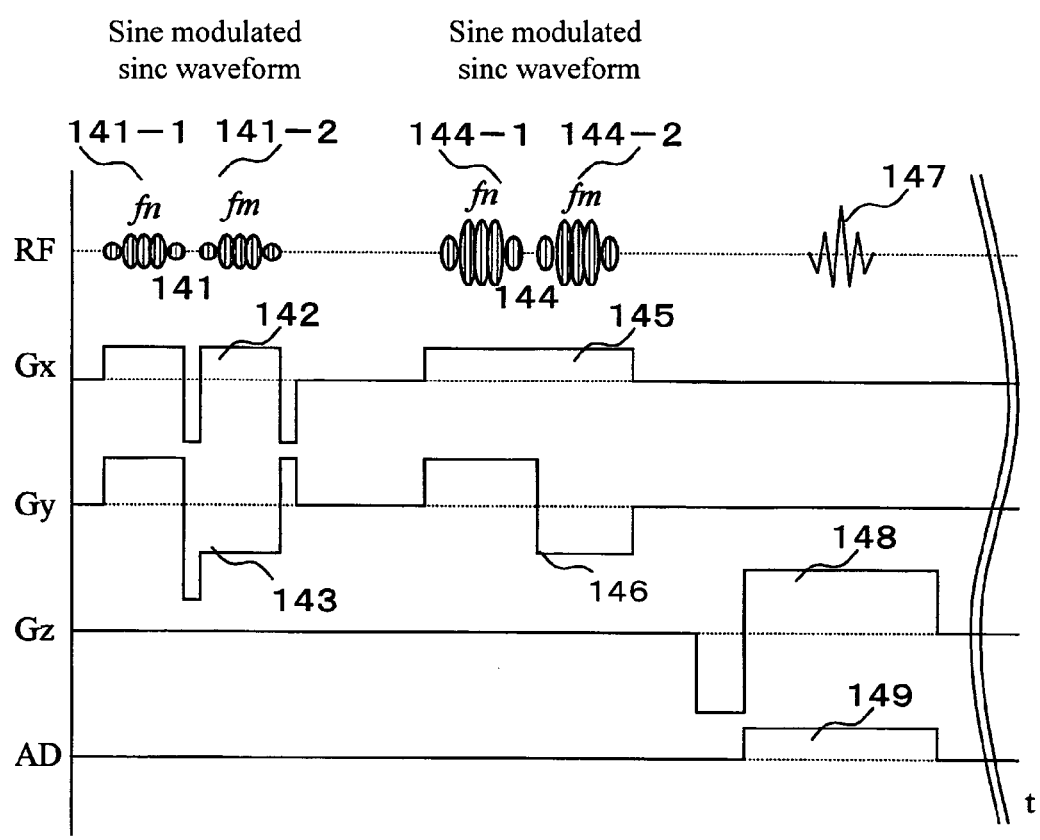
FIG. 16 is another imaging pulse sequence of the fourth embodiment.
Figure 17:
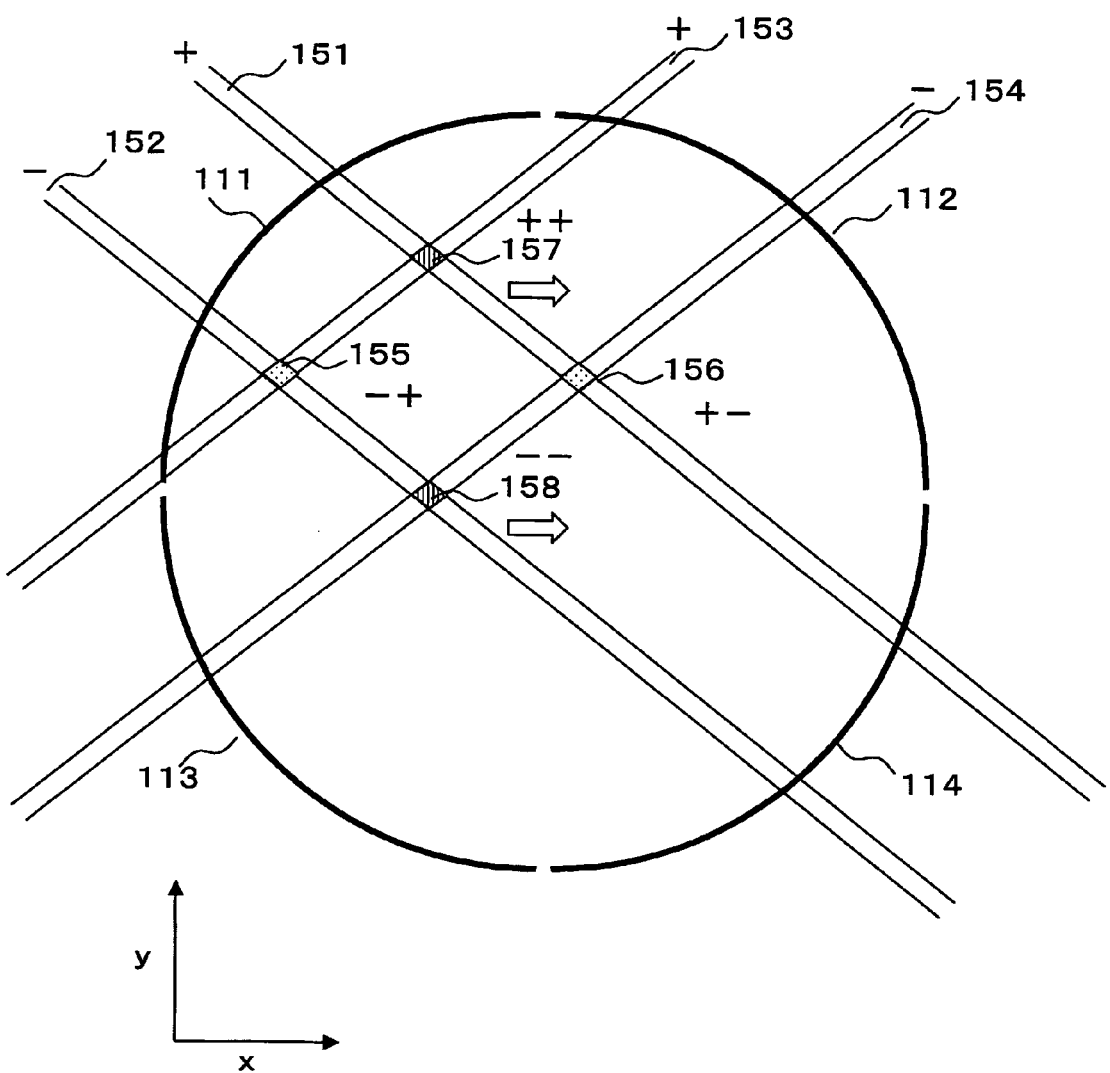
FIG. 17 is a schematic view of an area excited by another imaging pulse sequence of the fourth embodiment.

FIG. 16 is an imaging pulse sequence for generating a measurement signal only from two crossing areas. Furthermore, FIG. 17 illustrates areas to be excited by the imaging pulse sequence in FIG. 16. Here, this embodiment will be explained using the xz plane. In FIG. 16, the horizontal axis shows time (t), the vertical axis shows a high-frequency electromagnetic field RF and gradient magnetic fields Gx, Gy and Gz, and their respective operation timings and intensities are indicated. AD is a data acquisition period. Furthermore, the control apparatus 14 controls operations of the RF pulse application section, signal detection section and gradient magnetic field application section according to this imaging pulse sequence and acquires echoes.

Together with application of a slice gradient magnetic field 142 and a slice gradient magnetic field 143, a first RF pulse 141 is applied which is a set of two RF pulses having two excitation planes; a first RF pulse having a frequency of fn and a second RF pulse having a frequency of fm. Suppose the respective RF pulses are 141-1 and 141-2. Here, a sinc pulse modulated so that the two excitation areas have mutually opposite excitation phases, for example, a sinc pulse to which the sine modulation shown in FIG. 7(a) is applied is used for the individual RF pulses 141-1 and 141-2 of the first RF pulse 141. Furthermore, suppose intensities of the individual RF pulses 141-1 and 141-2 making up the first RF pulse are 45 degrees. Furthermore, as shown in FIG. 16, when the second pulse 141-2 of the first RF pulse 141 is applied, the slice gradient magnetic field 143 is inverted.

A nuclear magnetic resonance phenomenon is induced in two slices 151 and 152 shown in FIG. 17 by the first pulse 141-1 of the first RF pulse 141 and the gradient magnetic fields 142 and 143. However, the phase of the excitation profile of the slice 151 is plus (+), that of the slice 152 is minus (−) and nuclear magnetization is inclined by 45 degrees. Next, a nuclear magnetic resonance phenomenon is induced in two slices 153 and 154 shown in FIG. 17 by the second pulse 141-2 of the first RF pulse 141 and the gradient magnetic fields 142 and 143. However, the phase of the excitation profile of the slice 153 is + and that of the excitation slice 154 is − and nuclear magnetization is inclined by 45 degrees. In this way, a crossing area 157, both phases of excitation profile of which are + and nuclear magnetization of which is inclined, and a crossing area 158, both phases of excitation profile of which are − and nuclear magnetization of which is inclined by the first RF pulse 141 and the gradient magnetic fields 142 and 143, cause nuclear magnetization to be inclined by 90 degrees as a consequence. On the contrary, nuclear magnetization of other crossing areas 155 and 156 is 0 degrees and no excitation occurs.

Next, together with application of a slice gradient magnetic field 145 and a slice gradient magnetic field 146, a second RF pulse 144 is applied which is a set of two RF pulses having two excitation planes; a first RF pulse having a frequency of fn and a second RF pulse having a frequency of fm. Suppose the respective RF pulses are 144-1 and 144-2. Here, a sinc pulse to which the sine modulation shown in FIG. 7(a) is applied is used for the individual RF pulses 144-1 and 144-2 of the second RF pulse 144. However, the intensities of the individual RF pulses 144-1 and 144-2 making up the second RF pulse are both 90 degrees. This causes nuclear magnetization to be inclined by 180 degrees in only the crossing areas 157 and 158 where nuclear magnetization is inclined by the first RF pulse 141 and the gradient magnetic fields 142 and 143 and an echo 147 is generated. Therefore, only measurement signals from the crossing areas 157 and 158 are mixed in the echo 147.

In this embodiment, the control apparatus 14 also changes the frequencies fn and fm of the first RF pulse 141 and the frequencies fn and fm of the second RF pulse 144, moves the slice planes 151, 152, 153 and 154 in the x direction and consequently moves the crossing areas 157 and 158 in the x direction. By repeating this, measurement signals of the whole area in predetermined two slices parallel to the x direction are acquired. In this embodiment, the frequencies fn and fm of the first RF pulse 141 and the second RF pulse 144 are also increased by $\Delta fn$ and $\Delta fm$ respectively for every measurement, the excitation frequency is changed in a stepped fashion and the crossing areas 155, 156, 157 and 158 are moved. That is, the frequencies of the first RF pulse 141 and the second RF pulse 144 at a kth measurement are expressed as $fn=fn0+k\cdot\Delta fn$ and $fm=fm0+k\cdot\Delta fm$ (where, fn0 and fm0 are initial frequencies, k is the number of measurements, and $\Delta fn$ and $\Delta fm$ are increments respectively).

Furthermore, when the slice planes 151 and 152 and the slice planes 153 and 154 have the same thickness, and cross each other at right angles, that is, when the planes of projection of the crossing areas 157 and 158 onto the xy plane are square, $\Delta fn=4/C$ and $\Delta fm=-4/C$ may be set so as to thoroughly scan the slices of the whole measurement area without overlapping each other. Here, C represents a period (sec) of a sinc waveform before modulation as in the case of the first embodiment.

To fast acquire a slice including the crossing areas 157 and 158, that is, one slice parallel to the y direction in this embodiment, the excitation frequency is changed so as to move the crossing areas 157 and 158 in the y direction. For example, signs of the steps of changing frequencies are changed according to the scanning direction such as setting $\Delta fn=-4/C$ and $\Delta fm=4/C$. Signs of the changing steps vary depending on the sign of application of the gradient magnetic field. An offset $\Delta ps$ at a slice position generally has a relationship of $\Delta ps=2\pi\cdot\Delta f/(\gamma\cdot gs)$ ($\Delta f$ is a frequency offset, gs is amplitude of slice gradient magnetic field applied, $\gamma$ is gyromagnetic ratio). The excitation position is adjusted using this relationship.

Due to incompleteness of the excitation profile, measurement signals are slightly generated from edges of the excitation area by this imaging pulse sequence alone. For this reason, generations of unnecessary measurement signals are suppressed using optimization pulses such as SLR (Shinnar-LeRoux) pulse so that the excitation profile approximates to a complete one. Furthermore, an OVS (Outer Volume Suppression) pulse may be applied as a pre-pulse of this imaging pulse sequence to further suppress unnecessary signals. Furthermore, unnecessary lines may also be set outside the sensitivity of the measuring object or RF coil.

As explained so far, using such pulse shapes that the excitation phases of the first RF pulse 141-1 and the second RF pulse 141-2 of the first RF pulse 141 are inverted on a plurality of planes, these pulses are applied as 45-degree pulses, then the first RF pulse 144-1 and the second RF pulse 144-2 of the second RF pulse 144 are applied as 90-degree pulses, and, only the magnetic resonance signal from the crossing area out of the plurality of crossing areas, where the excitation phases of both the first RF pulse 141-1 and second RF pulse 141-2 of the first RF pulse match is substantially acquired. This makes it possible to substantially reduce the number of crossing areas which generate measurement signals and suppress the number of crossing areas to the required number in a higher degree of freedom in selecting crossing areas compared to the first to third embodiments.

This embodiment may also adopt such settings that the number of RF coils is 8, the number of planes excited by the first excitation pulse is 3, the number of planes excited by the second excitation pulse is 2 and the number of crossing areas is 6. Furthermore, it is also possible to use a method of suppressing measurement signals from two crossing areas, set the number of planes excited by the first excitation pulse to 3, the number of planes excited by the second excitation pulse to 3 and make settings so as to suppress signals from 4 out of 9 crossing areas. In this way, adding, to an imaging pulse sequence, a mechanism of restricting the number of crossing areas generating measurement signals to the number of RF coils or below increases the possibility of obtaining an inverse matrix of a sensitivity matrix when reconstructing an image and also increases the possibility that signals can be separated from a plurality of crossing areas. Moreover, it is also possible to increase the number of planes excited by the first excitation pulse and the second excitation pulse to more than 3 and increase the number of crossing areas simultaneously acquired. To increase the number of planes excited, it is possible to change modulation frequencies of a sinc waveform, cosine modulation sinc waveform and sine modulation sinc waveform, generate adequately added/subtracted waveforms and use the waveforms as RF pulses. Alternatively, it is also possible to use waveforms generated by adequately adding/subtracting sinc waveforms of different frequencies. This is because when planes to be excited should be added, the corresponding RF pulses may be added, or so-called additivity is established.

Fifth Embodiment

Next, a fifth embodiment will be explained. The MRI system of this embodiment basically has a configuration similar to those of the above described embodiments. This embodiment adds a gradient magnetic field for diffusion enhancement to the aforementioned techniques of the embodiments and acquires a diffusion image. Here, a case where a diffusion enhanced gradient magnetic field is added to the imaging pulse sequence shown in a third embodiment will be explained as an example. Hereinafter, this embodiment will be explained focusing on the configuration different from that of the third embodiment.

Figure 18:
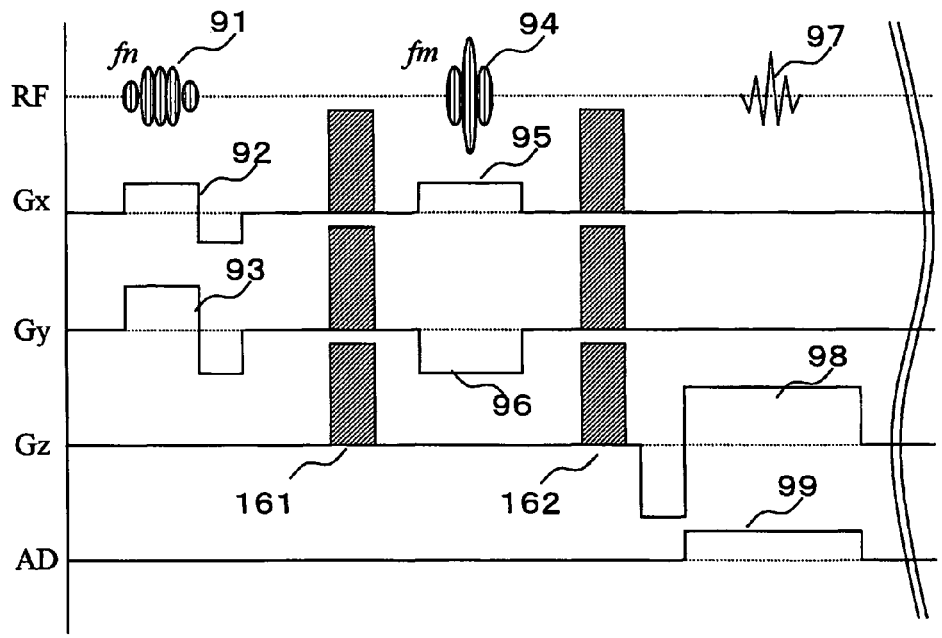
FIG. 18 is an imaging pulse sequence according to a fifth embodiment.

FIG. 18 is an imaging pulse sequence of this embodiment. In this figure, the horizontal axis shows time (t) and the vertical axis shows a high-frequency electromagnetic field RF and gradient magnetic fields Gx, Gy and Gz, and their respective operation timings and intensities are indicated. AD denotes a period during which data is acquired. Here, components having the same functions as those in the imaging pulse sequence of the third embodiment are assigned the same reference numerals.

The difference from the imaging pulse sequence of the third embodiment lies in that diffusion gradient magnetic fields 161 and 162 are applied before and after a second RF pulse 94. The two diffusion gradient magnetic fields 161 and 162 are adjusted so that the product of amplitude and duration becomes equal and magnetic resonance signals are made to attenuate as molecular diffusion becomes more intense. In this way, the intensity of diffusion can be measured. The measurement flow and the image reconstruction method are the same as those of the third embodiment.

As explained so far, to acquire an echo necessary to reconstruct a diffusion weighted image which is susceptible to body movement, the gradient magnetic field application section of this embodiment applies at least one set of mutually compensating diffusion enhanced gradient magnetic fields for detecting molecular diffusion from the first or second excitation pulse, whichever is temporally earlier, until the signal detection section measures the magnetic resonance signal. In the case of a sequence using a phase encoding gradient magnetic field, if a diffusion gradient magnetic field is applied, even slight body movement may cause a great phase error and produce an artifact as if the object flows in the phase encoding direction. A conventional line scan method using a single line can suppress such an artifact, but takes more measurement time. This embodiment can simultaneously acquire measurement signals of a plurality of crossing areas and can shorten the measurement time in terms of measurement time per slice.

The sequence displayed is a typical example and it is possible to change the imaging pulse sequence by changing the diffusion gradient magnetic field to a bipolar type, changing the amplitude and time interval or the like of the diffusion gradient magnetic field, acquiring a plurality of images with the rate of signal attenuation by molecular diffusion changed and calculating ADC (Apparent Diffusion Coefficient) or the like. Furthermore, it is also possible to combine various techniques related to diffusion measurement such as using a plurality of directions in which the diffusion gradient magnetic field is applied, calculating diffusion anisotropy and performing tractography or the like. Furthermore, the case where the imaging pulse sequence of the third embodiment is used has been explained as an example here, but this embodiment is also applicable to the imaging pulse sequence of any one of the first, second and fourth embodiments.

Sixth Embodiment

Next, a sixth embodiment will be explained. The MRI system of this embodiment basically has a configuration similar to those of the first to fourth embodiments. This embodiment applies the technique of scanning a plurality of lines explained in the first to fourth embodiments to a high-speed imaging technique such as EPI (Echo Planar Imaging). Hereinafter, a case where the technique of the first embodiment is applied to EPI will be explained as an example. Here, this embodiment will be explained focusing on the configuration different from that of the first embodiment.

Figure 19:
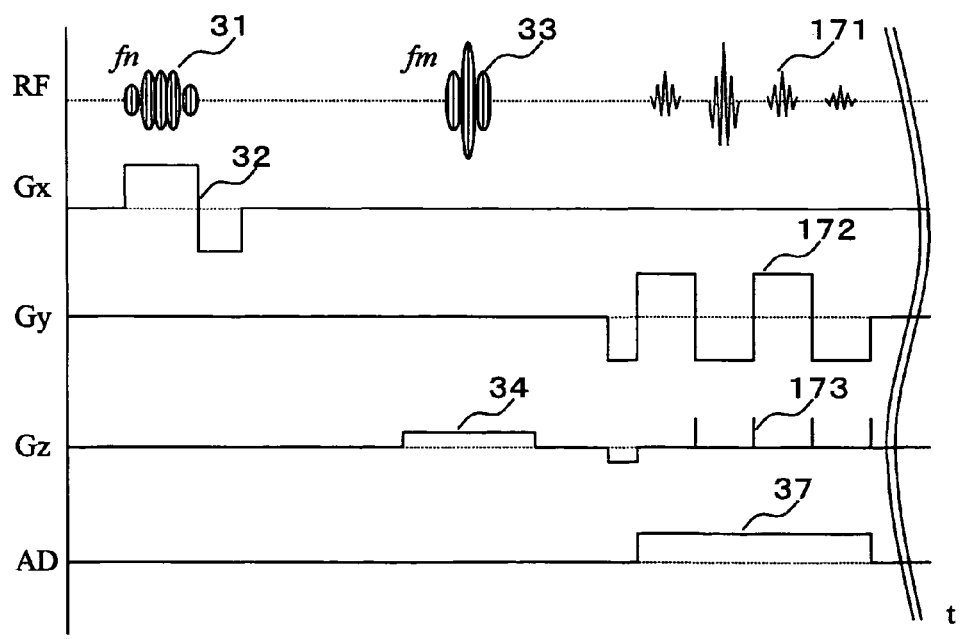
FIG. 19 is an imaging pulse sequence according to a sixth embodiment.

FIG. 19 shows an imaging pulse sequence of this embodiment. In this figure, the horizontal axis shows time (t), the vertical axis shows a high-frequency electromagnetic field RF and gradient magnetic fields Gx, Gy and Gz, and their respective operation timings and intensities are indicated. AD is a data acquisition period. Here, components having the same functions as those in the imaging pulse sequence of the first embodiment are assigned the same reference numerals.

The difference from the imaging pulse sequence of the first embodiment lies in that the amplitude of a slice gradient magnetic field 34 applied is smaller than that of the imaging pulse sequence of the first embodiment and that a oscillating gradient magnetic field 172 and a blip-shaped gradient magnetic field 173 used for EPI are applied in the y direction and the z direction respectively as a read-out gradient magnetic field. Since the amplitude of the slice gradient magnetic field 34 applied is smaller than that of the imaging pulse sequence of the first embodiment, the slice plane to be excited of this embodiment is wider than the first embodiment. Furthermore, since the oscillating gradient magnetic field 172 and blip-shaped gradient magnetic field 173 are applied, the number of echoes 171 measured is plural.

Figure 20:
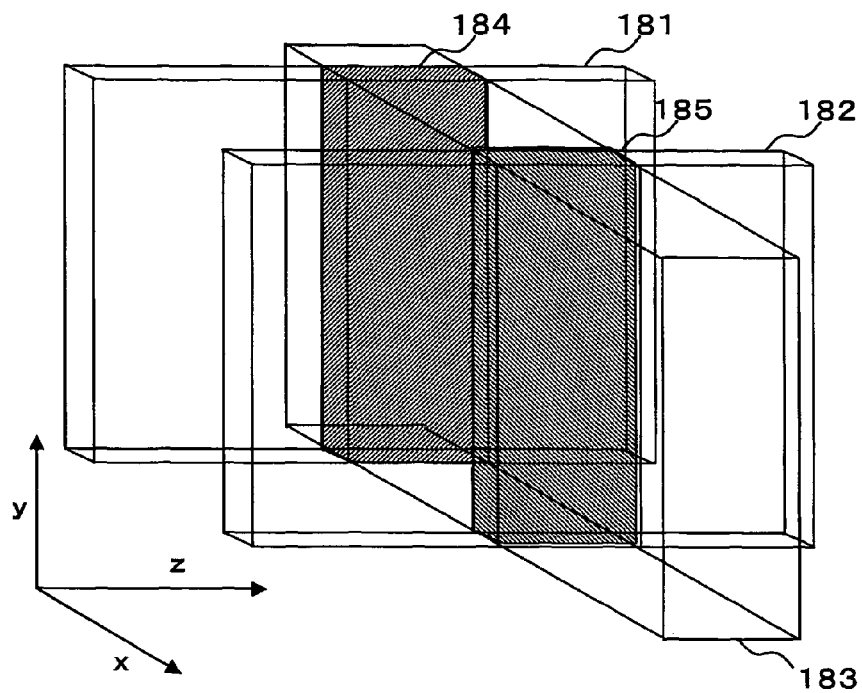
FIG. 20 illustrates an area excited by the imaging pulse sequence of the sixth embodiment.
Figure 20:
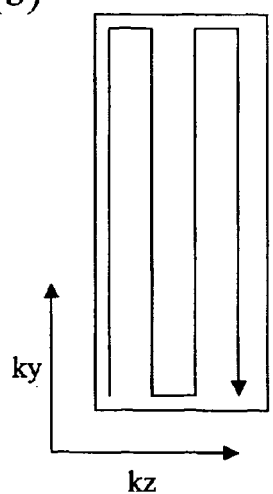

The excitation area in this imaging pulse sequence will be explained using FIG. 20. As shown in FIG. 20(a), compared with the case shown in FIG. 4, the thickness of a slice plane 183 by the second excitation pulse is greater and crossing areas 184 and 185 between slice planes 181 and 182 and the slice plane 183 are slab-like areas. The excited crossing areas (slabs) 184 and 185 are filled with data in a k-space by the oscillating gradient magnetic field 172 applied in the y direction and the blip-shaped gradient magnetic field 173 applied in the z direction as shown in FIG. 20(b). When the magnetic resonance signals measured by the RF coils 22 and 23 are processed according to the image reconstruction method generally used in EPI, two images are obtained in which the magnetic resonance signals from the two crossing areas (slabs) 184 and 185 measured according to the sensitivity distributions of the coils 22 and 23 are mixed. On the contrary, this embodiment also performs separation processing similar to that in the first embodiment and obtains two-dimensional images of the crossing areas 184 and 185.

By repeating the above described processing, the whole measurement area is thoroughly scanned and a three-dimensional image is reconstructed from echoes obtained. FIG. 20(c) shows an example of scanning order on the xz plane. Here, the two slabs assigned the same numbers are slabs (crossing areas) acquired simultaneously. Acquisition of measurement signals from this one set of slabs (crossing areas) is repeated in order of numbers assigned. The scanning shown in this figure can be realized by changing the frequency fn of the first RF pulse 31 in a step fashion between frequencies corresponding from one end to the other of the slab and alternately repeating the frequency fm of the second RF pulse 34 between fm and fm+Δfm.

For example, the scanning is carried out as follows. Here, fn0 and fm0 are initial frequencies, k is the number of measurements, Δfn and Δfm are increments respectively, mod(k, 2) is a function which becomes 0 when k is an even number and 1 when k is an odd number.

When the number of measurements k=1, 2, 3, 4, $fn=fn0+(k-1)\cdot\Delta fn$, $fm=fm0+mod((k-1),2)\cdot\Delta fm$ When the number of measurements k=5, 6, 7

$fn=fn0+(k-4)\cdot\Delta fn$, $fm=fm0+mod(1-(k-1),2)\cdot\Delta fm$

When the number of measurements k=8

$fn=fn0+(k-4)\cdot\Delta fn$, $fm=fm0+mod(1-(k-1),2)\cdot\Delta fm$

When the crossing area to be acquired is moved as shown in this figure, if the crossing area is shifted to the next crossing area as described in the third embodiment, the preceding excitation slice has little influence. This eliminates the necessity for setting a long waiting time for magnetization to recover and enables the measurement time to be shortened. The rest of the measurement flow, method of separating magnetic resonance signals from a plurality of slices (slabs) and image reconstruction method of this embodiment are the same as those of the first embodiment.

As explained so far, according to this embodiment, to prevent the cross section of the crossing area from widening and prevent spatial resolution of the image from reducing, the gradient magnetic field application section applies a gradient magnetic field in the y direction of the crossing area and in the first or second direction perpendicular thereto or in two directions perpendicular to the y direction and acquires spatial information on the inside of the crossing area. This enables a two-dimensional image or three-dimensional image in the crossing area to be acquired and can thereby increase spatial resolution of the image. That is, this embodiment fills the k-space in zigzags with a blip-shaped gradient magnetic field in the slab-shaped crossing area, and therefore spatial resolution can be increased if sufficient data is acquired in the kz direction. Furthermore, according to this embodiment, since no repetitive phase encoding gradient magnetic field for adding spatial information is used, body movement artifacts caused by this are suppressed. Two slabs are acquired simultaneously on that basis and therefore the measurement time can be shortened.

This embodiment has been explained taking a case where EPI is used as the method of imaging the inside of the slab-shaped crossing area as an example. However, the imaging technique used is not limited to this. For example, it is possible to combine high-speed imaging such as FLASH and Fast Spin Echo. Furthermore, the case where the line scan technique with a plurality of lines of the first embodiment is applied to the high-speed imaging technique has been explained as an example, but the second to fourth embodiments can also be applied likewise.

Furthermore, this embodiment may also be combined with a SENSE method of reducing a phase encoding count using the coil sensitivity distribution in the slab. For example, it is possible to reduce phase encoding of EPI (blip phase encoding) and reduce influences of T2 and T2*.

The size of the slab to be excited by line scan with a plurality of lines of this embodiment need not always be the same as the field of view of high-speed imaging. By making the field of view of high-speed imaging greater than the slab, it is possible to calculate dropping of a signal at the end of the slab, make a correction or smoothly connect images of neighboring slabs.

When the amplitude of the blip-shaped gradient magnetic field 173 applied or the application time is reduced, the field of view in the y direction is widened. Therefore, an amplitude Gbz of the blip-shaped gradient magnetic field or an application time Tbz may be adjusted so that the field of view Ly ($=2\pi/(\gamma\cdot Gbz\cdot Tbz)$) in the y direction and the thickness Sy ($=4\pi/(\gamma\cdot Gsz\cdot C)$) of the plane excited by the RF pulse 33 satisfy a relationship of Ly>Sy. Here, $\gamma$ is a gyromagnetic ratio, Gbz is the amplitude of the blip-shaped gradient magnetic field 173 applied, Tbz is an application time of each blip, C is a period (sec) of a sinc waveform and Gsz is the amplitude of the gradient magnetic field 34 applied.

Scanning of the whole measurement area is not limited to the above described procedure. For example, it is also possible to repeat the procedure of changing the first RF pulse fn in a stepped fashion, complete scanning of the whole measurement area in the x direction, then changing the second RF pulse fm in a stepped fashion and moving the measurement area in the z direction.

Seventh Embodiment

Next, a seventh embodiment will be explained. The MRI apparatus of this embodiment basically has a configuration similar to those of the first to fourth embodiments. This embodiment applies the technique of line scan with a plurality of lines explained in the first to fourth embodiments to a chemical shift imaging technique. Hereinafter, a case where the technique of the first embodiment is applied will be explained as an example. Here, this embodiment will be explained focusing on the configuration different from that of the first embodiment.

Figure 21:
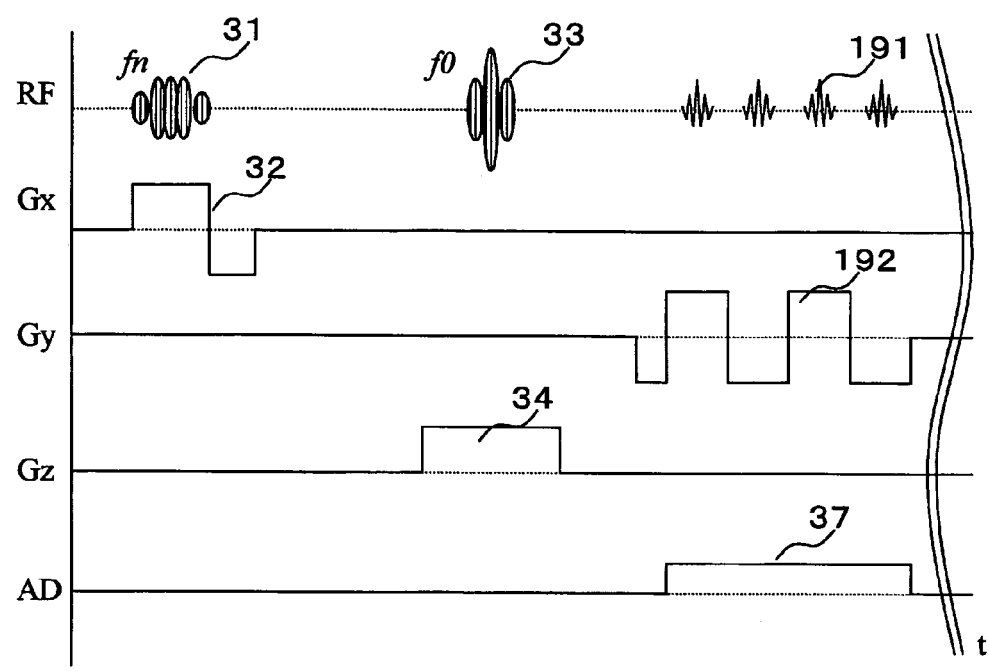
FIG. 21 is an imaging pulse sequence according to a seventh embodiment.

FIG. 21 is an imaging pulse sequence of this embodiment. In this figure, the horizontal axis shows time (t), the vertical axis shows a high-frequency electromagnetic field RF and gradient magnetic fields Gx, Gy and Gz, and their respective operation timings and intensities are indicated. AD is a data acquisition period. Here, components having the same functions as those in the imaging pulse sequence of the first embodiment are assigned the same reference numerals.

The difference from the imaging pulse sequence of the first embodiment lies in that a oscillating gradient magnetic field 192 is applied in the y direction as the read-out gradient magnetic field. Accordingly, the number of echoes 191 measured is plural and a oscillating gradient magnetic field 192 adds the spatial information in the y direction and chemical shift information to the echo 191. In the image reconstruction processing, when each echo 191 acquired is charged into a k-space by being inverted in a positive or negative direction depending on whether the echo is even-numbered or odd-numbered or charged into the k-space by only extracting even-numbered echoes or odd-numbered echoes separately and a two-dimensional FFT is applied thereto, one-dimensional chemical shift imaging data having spatial information in the y direction and chemical shift information is obtained. In the imaging pulse sequence of this embodiment, the descriptions of a water suppression pulse and OVS (Outer Volume Suppression) pulse necessary for chemical shift imaging will be omitted.

As in the case of the first embodiment, measurement signals of the two crossing areas 44 and 45 are mixed with one-dimensional chemical shift imaging data acquired by the RF coils 22 and 23. The chemical shift data is separated into chemical shift data of the respective areas using the separation method explained in the first embodiment. Furthermore, as in the case of the first embodiment, two-dimensional chemical shift imaging data is acquired by changing the frequency of the first excitation pulse, shifting the crossing areas 44 and 45 and repeating the same processing. Furthermore, three-dimensional chemical shift imaging data can also be acquired by also shifting the crossing areas in the z direction and repeating similar processing. The rest of the measurement flow and image reconstruction method of this embodiment are basically the same as those of the first embodiment.

The case where this embodiment is applied to the first embodiment has been explained so far as an example, but this embodiment is also applicable to any one of the second to fourth embodiments. For example, by applying a configuration similar to that of the fourth embodiment to the RF coil and using the imaging pulse sequence of the fourth embodiment, it is possible to perform three-dimensional chemical shift imaging. Furthermore, this embodiment is also applicable to a sequence to which the diffusion weighting described in the fifth embodiment is added.

As explained above, according to this embodiment, in order to fast acquire an echo necessary for chemical shift imaging whose measurement time is prone to increase, the gradient magnetic field application section applies a oscillating gradient magnetic field for adding spatial information in the linear direction of the crossing areas and chemical shift information to the measurement time of the magnetic resonance signals. Furthermore, a diffusion gradient magnetic field is added to acquire molecular diffusion information of each metabolite. The diffusion coefficient of a metabolite which is a target of chemical shift imaging is generally lower than that of a water molecule. Thus, a strong diffusion gradient magnetic field needs to be applied, and therefore body movement artifacts are likely to occur. However, this embodiment scans a plurality of lines simultaneously, and can thereby shorten the measurement time and effectively suppress these body movement artifacts.

In this embodiment, in order to prevent the cross section of the crossing area from widening and prevent spatial resolution of images from reducing as in the case of the sixth embodiment, the gradient magnetic field application section may also apply a gradient magnetic field in the y direction of the crossing area, first or second direction perpendicular thereto or two directions perpendicular to the y direction and acquire spatial information on the inside of the crossing area. This improves spatial resolution of two-dimensional chemical shift imaging and three-dimensional chemical shift imaging.

Compared to general single-line scan, this embodiment can also shorten the measurement time and further reduce the possibility that body movement artifacts may get mixed.

Eighth Embodiment

Next, an eighth embodiment will be explained. The MRI system of this embodiment basically has a configuration similar to those of the above described embodiments. However, since this embodiment performs reception in such a way that signals from a plurality of crossing areas do not get mixed, this embodiment performs no separation processing on magnetic resonance signals. Therefore, since this embodiment uses no sensitivity distribution of RF coils for processing, the number of RF coils on the receiving side need not be plural. Hereinafter, a case of this embodiment where the imaging pulse sequence of the first embodiment is used will be explained as an example. Here, this embodiment will be explained focusing on the configuration different from that of the first embodiment.

Figure 22:
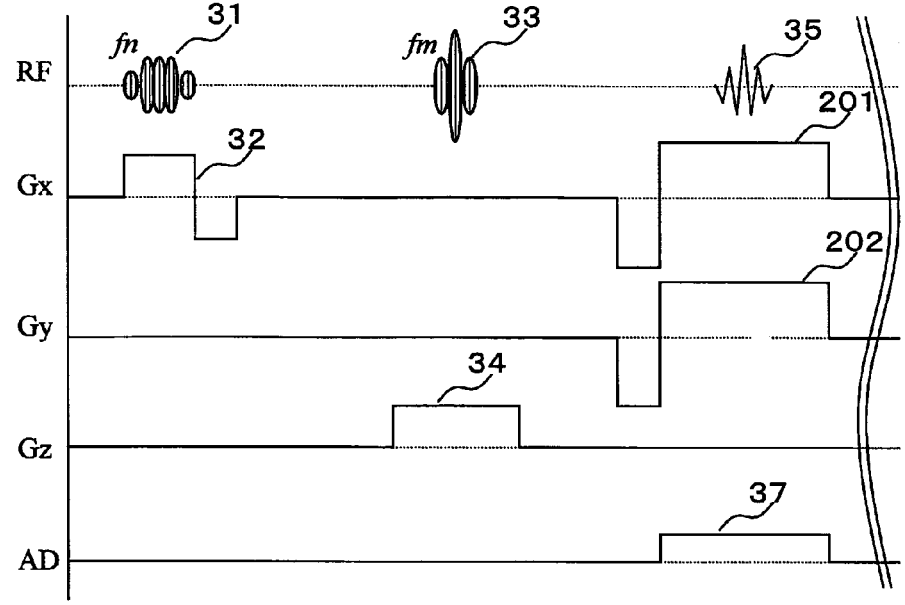
FIG. 22 illustrates an imaging pulse sequence and an addition of spatial information according to an eighth embodiment.
Figure 22:
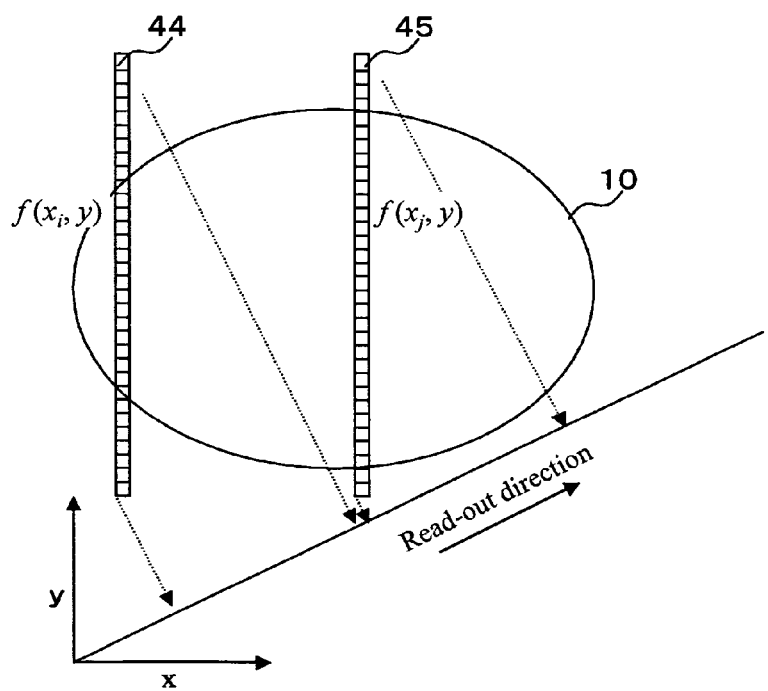

FIG. 22(a) is an imaging pulse sequence diagram of this embodiment. Here, the horizontal axis shows time (t) and the vertical axis shows a high-frequency electromagnetic field RF and gradient magnetic fields Gx, Gy and Gz, and their respective operation timings and intensities are indicated. AD denotes a period during which data is acquired. Here, components having the same functions as those in the imaging pulse sequence of the first embodiment are assigned the same reference numerals.

The difference from the imaging pulse sequence of the third embodiment lies in that read-out gradient magnetic fields 201 and 202 are applied in the xy direction. Since this embodiment receive two magnetic resonance signals from crossing areas 44 and 45 as signals independent of each other, this embodiment applies a read-out gradient magnetic field in a direction in which the projected signals do not overlap each other.

FIG. 22(b) illustrates how this embodiment adds spatial information. When magnetic resonance signals generated from the crossing areas 44 and 45 excited by the first excitation pulse and second excitation pulse are assumed to be f(xi, y), f(xj, y), a read-out gradient magnetic field is applied in a direction in which the respective projected signals do not overlap each other. That is, the read-out gradient magnetic field is applied so as to have an angle between the direction perpendicular to the diagonal of the rectangle, two sides of which are the crossing areas 44 and 45 and the direction perpendicular to both the crossing areas 44 and 45. More specifically, when it is assumed that the field of view in the y direction is Ly and the distance between the two crossing areas 44 and 45 is |xi−xj|, the angle of the direction in which the read-out gradient magnetic field is applied may be set to arctan(Ly/|xi−xj|≠0) or below. That is, when it is assumed that the amplitude of the read-out gradient magnetic field 201 applied is gx and the amplitude of the read-out gradient magnetic field 202 applied is gy, the direction of application is controlled so as to satisfy gy/gx<=|xi−xj|/Ly(gx≠0, gy≠0).

In a single echo obtained by applying the read-out gradient magnetic fields 201 and 202 as shown above, the high-frequency component is a measurement signal from the crossing area 45 and the low-frequency component is a measurement signal from the crossing area 44 and it is possible to distinguish measurement signals from both crossing areas.

Since this embodiment can simultaneously acquire measurement signals from a plurality of lines, the measurement time can be shortened. Of course, the body movement artifact suppression effect that line scan originally has is maintained.

As explained so far, each embodiment applies excitation pulses for exciting a plurality of slice planes and excitation pulses for exciting slice planes perpendicular to the slice planes and simultaneously measures a plurality of substantially parallel linear crossing areas. In that case, spatial information of a direction parallel to both planes in an area where planes (slices) cross each other (linear direction) is acquired by modulating the magnetic resonance signal by a gradient magnetic field, and spatial information of a direction perpendicular to the linear direction is acquired by changing the position of the plane. This enables a two-dimensional image, three-dimensional image, two-dimensional chemical shift imaging or three-dimensional chemical shift imaging to be acquired fast. Therefore, according to the above described embodiments, it is possible to shorten the measurement time of the magnetic resonance imaging system and improve the accuracy or the like and improve performance. Especially, it is possible to shorten a measurement time while suppressing body movement artifacts generated when body movement occurs in a measuring object.

What is claimed is:

1. A magnetic resonance imaging system comprising:
an RF pulse application section which applies a high-frequency electromagnetic field (RF) pulse to a measuring object;
a signal detection section which measures a magnetic resonance signal from the measuring object caused by the RF pulse;
a gradient magnetic field application section which applies a gradient magnetic field for adding spatial modulation to the magnetic resonance signal;
a calculation section which reconstructs an image from the magnetic resonance signal measured by the signal detection section; and
a control section which controls operations of the RF pulse application section, the signal detection section, the gradient magnetic field application section and the calculation section,
wherein the control section performs control so as to apply a first RF pulse having a plurality of substantially parallel excitation planes together with a first gradient magnetic field, apply a second RF pulse together with a second gradient magnetic field in a direction different from the direction in which the first gradient magnetic field is applied and controls the RF pulse application section and the gradient magnetic field application section so as to apply a third gradient magnetic field in a direction perpendicular to both the first gradient magnetic field and the second gradient magnetic field for a period during which the signal detection section measures the magnetic resonance signal.

2. The magnetic resonance imaging system according to claim 1, wherein the signal detection section comprises RF reception coils in number equal to or greater than a plurality of crossing areas in which a plurality of excitation planes excited by the first gradient magnetic field and the first RF pulse and an excitation plane excited by the second gradient magnetic field and the second RF pulse cross each other,
the plurality of RF reception coils are arranged at positions at which magnetic resonance signals from the plurality of crossing areas are received with different sensitivities, and
the control section causes the calculation section to separate the magnetic resonance signals from the plurality of crossing areas into magnetic resonance signals of the respective crossing areas using sensitivity distributions of the plurality of RF reception coils.

3. The magnetic resonance imaging system according to claim 1, wherein the second RF pulse comprises a plurality of substantially parallel excitation planes.

4. The magnetic resonance imaging system according to claim 1, wherein the first RF pulse is modulated so that excitation phases of mutually neighboring excitation planes of the plurality of excitation planes excited by the first RF pulse and the first gradient magnetic field are alternately inverted.

5. The magnetic resonance imaging system according to claim 3, wherein the second RF pulse is modulated so that excitation phases of mutually neighboring excitation planes of the plurality of excitation planes excited by the second RF pulse and the second gradient magnetic field are alternately inverted.

6. The magnetic resonance imaging system according to claim 1, wherein any one of the first RF pulse and the second RF pulse is a 90-degree pulse whose amplitude is set to 90 degrees and the other is a 180-degree pulse whose amplitude is set to 180 degrees.

7. The magnetic resonance imaging system according to claim 3, wherein both the first RF pulse and the second RF pulse are modulated so that excitation phases of mutually neighboring excitation planes of the plurality of excitation planes excited by the first RF pulse or the second RF pulse are alternately inverted, and
the control section controls the RF pulse application section so that the RF pulse which alternately suppresses the plurality of crossing areas along the respective excitation planes is applied immediately after applications of the first RF pulse and the second RF pulse.

8. The magnetic resonance imaging system according to claim 1, wherein the control section changes the frequency of the first RF pulse, moves the excitation plane and repeats application of the first RF pulse and application of the second RF pulse.

9. The magnetic resonance imaging system according to claim 2, wherein the control section changes the frequency of the first RF pulse, moves the excitation plane and repeats application of the first RF pulse and application of the second RF pulse and separation of magnetic resonance signals of the respective high-frequency areas.

10. The magnetic resonance imaging system according to claim 1, wherein the control section performs control so that at least one set of mutually compensating diffusion gradient magnetic fields for the gradient magnetic field application section to detect molecular diffusion from application of the first RF pulse or the second RF pulse, whichever is applied temporally earlier until the signal detection section measures a magnetic resonance signal.

11. The magnetic resonance imaging system according to claim 1, wherein the third gradient magnetic field is a oscillating gradient magnetic field which simultaneously adds chemical shift information and spatial information to the magnetic resonance signal.

12. The magnetic resonance imaging system according to claim 1, wherein the control section controls, for a period during which the signal detection section measures the magnetic resonance signal, the gradient magnetic field application section so as to further apply a gradient magnetic field to at least one of the direction of the first gradient magnetic field and the direction of the second gradient magnetic field.

13. The magnetic resonance imaging system according to claim 2, wherein the plurality of RF reception coils are loop coils and the respective loop coils are arranged in parallel so that the respective loop planes are not parallel to the excitation plane by the first RF pulse and not parallel to the excitation plane.

14. The magnetic resonance imaging system according to claim 1, wherein the third gradient magnetic field is applied at an angle between the direction perpendicular to a diagonal of a rectangle, two sides of which are the mutually neighboring crossing areas of a plurality of crossing areas of a first excitation plane excited by the first gradient magnetic field and the first RF pulse and a second excitation plane excited by the second gradient magnetic field and the second RF pulse, and the direction perpendicular to the crossing area.

* * * * *